United States Patent
Kim et al.

(10) Patent No.: US 11,442,545 B2
(45) Date of Patent: Sep. 13, 2022

(54) DISPLAY DEVICE HAVING VIBRATION ELECTRODES IN VIBRATION AREA AND METHOD OF DRIVING THE SAME

(71) Applicant: Samsung Display Co., LTD., Gyeonggi-do (KR)

(72) Inventors: Jong Tae Kim, Seoul (KR); Young Sik Kim, Yongin-si (KR); Jung Hak Kim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/806,846

(22) Filed: Mar. 2, 2020

(65) Prior Publication Data

US 2020/0401227 A1 Dec. 24, 2020

(51) Int. Cl.
| | |
|---|---|
| *G06F 3/01* | (2006.01) |
| *G06F 3/041* | (2006.01) |
| *G06F 1/18* | (2006.01) |
| *G06F 1/16* | (2006.01) |

(52) U.S. Cl.
CPC ............ *G06F 3/016* (2013.01); *G06F 1/1626* (2013.01); *G06F 1/1643* (2013.01); *G06F 1/189* (2013.01); *G06F 3/0412* (2013.01); *G06F 2203/014* (2013.01)

(58) Field of Classification Search
CPC ...................................................... G06F 3/016
USPC ........................................................ 345/156
See application file for complete search history.

(56) References Cited

U.S. PATENT DOCUMENTS

| | | | | |
|---|---|---|---|---|
| 2013/0249859 | A1* | 9/2013 | Park | G06F 3/0447 345/174 |
| 2014/0002427 | A1* | 1/2014 | Yeo | G06F 3/016 345/204 |
| 2016/0282944 | A1* | 9/2016 | Haga | G06F 3/04886 |
| 2016/0313793 | A1* | 10/2016 | Hong | G06F 3/0412 |
| 2017/0192507 | A1* | 7/2017 | Lee | G06F 3/016 |
| 2017/0192560 | A1* | 7/2017 | Ham | G06F 3/041 |
| 2018/0356889 | A1* | 12/2018 | Khoshkava | G06F 3/016 |
| 2020/0042133 | A1* | 2/2020 | Park | G06F 1/1637 |
| 2020/0353507 | A1* | 11/2020 | Zhao | G06K 9/0002 |

FOREIGN PATENT DOCUMENTS

| | | |
|---|---|---|
| KR | 1020110080316 | 7/2011 |
| KR | 1020140132163 | 11/2014 |
| KR | 1020160011148 | 1/2016 |
| KR | 1020160075019 | 6/2016 |
| KR | 1020160127282 | 11/2016 |
| KR | 101807454 | 12/2017 |
| KR | 1020180003521 | 1/2018 |
| KR | 1020180124235 | 11/2018 |
| KR | 1020190012142 | 2/2019 |

* cited by examiner

*Primary Examiner* — Long D Pham
(74) *Attorney, Agent, or Firm* — Cantor Colburn LLP

(57) ABSTRACT

A display device includes: a display unit including a display area and a non-display area; and a vibration generating unit disposed on the display unit and including a vibration area and a non-vibration area. The vibration generating unit includes first vibration electrodes, second vibration electrodes facing the first vibration electrodes, and vibration layers disposed between the first vibration electrodes and the second vibration electrodes, and the vibration layers are disposed in the vibration area and spaced apart from each other.

18 Claims, 24 Drawing Sheets

DISPLAY DEVICE HAVING VIBRATION ELECTRODES IN VIBRATION AREA AND METHOD OF DRIVING THE SAME

This application claims priority to Korean Patent Application No. 10-2019-0073133, filed on Jun. 19, 2019, and all the benefits accruing therefrom under 35 U.S.C. § 119, the content of which in its entirety is herein incorporated by reference.

BACKGROUND

1. Field

The disclosure relates to a display device and a method of driving the same.

2. Description of the Related Art

Electronic devices that provide images to a user, such as smartphones, tablet personal computers (PCs), digital cameras, notebook computers, navigation systems and smart televisions, include display devices for displaying images. A display device includes a display panel that generates and displays an image and various input devices.

A touch detection unit that recognizes a touch input is widely applied as an input device of a display device mainly in smartphones and tablet PCs. The touch detection unit determines whether a user's touch input has been made and calculates the touch position as coordinates of the touch input.

Recently, going further from touch sensors which detect touch positions, research has been conducted on haptic devices which provide vibration feedback on a user's touch input.

SUMMARY

Embodiments of the disclosure provide a display device with improved haptic characteristics and a method of driving the display device.

According to an embodiment of the invention, a display device includes: a display unit including a display area and a non-display area; and a vibration generating unit disposed on the display unit and including a vibration area and a non-vibration area, where the vibration generating unit includes first vibration electrodes, second vibration electrodes facing the first vibration electrodes, and vibration layers disposed between the first vibration electrodes and the second vibration electrodes, and the vibration layers are disposed in the vibration area and spaced apart from each other.

In an embodiment, the vibration generating unit may further include an insulating layer, and the insulating layer may be disposed between the vibration layers.

In an embodiment, the first vibration electrodes may be spaced apart from each other, the second vibration electrodes may be spaced apart from each other, and the first vibration electrodes and the second vibration electrodes may overlap each other with the vibration layers interposed between the first vibration electrodes and the second vibration electrodes.

In an embodiment, the vibration generating unit may further include: a first connection pattern which connects the first vibration electrodes in a first direction and a second connection pattern which connects the second vibration electrodes in a second direction intersecting the first direction.

In an embodiment, a width of the first connection pattern in the second direction may be smaller than a width of each of the first vibration electrodes in the second direction.

In an embodiment, a width of the second connection pattern in the first direction may be smaller than a width of each of the second vibration electrodes in the first direction.

In an embodiment, the first connection pattern and the second connection pattern may overlap the insulating layer in a thickness direction.

In an embodiment, the display device may further include: first vibration pads and second vibration pads which may be disposed in the non-vibration area; and first vibration lines which may be connected to the first vibration electrodes, one ends of the vibration lines may be respectively connected to the first vibration electrodes disposed in the same row, and other ends of the vibration lines may be respectively connected to the first vibration pads.

In an embodiment, the display device may further include second vibration lines which may be connected to the second vibration electrodes, one ends of the second vibration lines may be respectively connected to the second vibration electrodes disposed in the same column, and the other ends of the second vibration lines may be respectively connected to the second vibration pads.

In an embodiment, the vibration layers may include a ferroelectric polymer.

In an embodiment, the vibration layers may include polyvinylidene fluoride ("PVDF").

In an embodiment, the display device may further include a touch detection unit disposed on the vibration generating unit.

In an embodiment, the display device may further include a touch detection unit disposed between the display unit and the vibration generating unit.

In an embodiment, the display device may further include: a vibration driving circuit which applies driving voltages to the first vibration electrodes and the second vibration electrodes; and a touch driving circuit which detects a touch input and calculates touch coordinates of the touch input, where the touch driving circuit may transmit a touch coordinate signal to the vibration driving circuit.

According to an embodiment of the invention, a display device includes: a display unit including a display area and a non-display area; and a vibration generating unit disposed on the display unit and including a vibration area and a non-vibration area, where the vibration generating unit further includes vibration generating areas disposed in the vibration area and spaced apart from each other, and each of the vibration generating areas includes a first vibration electrode and a second vibration electrode facing each other, and a vibration layer disposed between the first vibration electrode and the second vibration electrode.

In an embodiment, the vibration layer may include PVDF and may be provided in plural in a form of islands in the vibration area.

In an embodiment, the display device may further include a touch detection unit which is disposed on the vibration generating unit and includes a plurality of touch electrodes, where each of the vibration generating areas may correspond to each of the touch electrodes.

In an embodiment, the display device may further include an insulating layer which is disposed in a same layer as the vibration layer and surrounds the vibration layer.

According to an embodiment of the invention, a method of driving a display device including a display unit, a vibration generating unit disposed on the display unit and including vibration generating areas spaced apart from each other, and a touch detection unit disposed on the vibration generating unit, includes: sensing a touch on a display device by using the touch detection unit; and providing a haptic feedback based on coordinates of the touch by using the vibration generating unit, where the providing the haptic feedback includes generating vibrations by applying a driving voltage to a vibration generating area corresponding to the coordinates of the touch by using the vibration generating unit.

In an embodiment, the display device may further include a vibration driving circuit which may apply the driving voltage and a touch driving circuit which may sense the touch, and the method may further include transmitting a touch coordinate signal generated based on the coordinates of the touch from the touch driving circuit to the vibration driving circuit.

BRIEF DESCRIPTION OF THE DRAWINGS

These and/or other features of the invention will become apparent and more readily appreciated from the following description of the embodiments, taken in conjunction with the accompanying drawings, in which.

DETAILED DESCRIPTION

Figure 1:
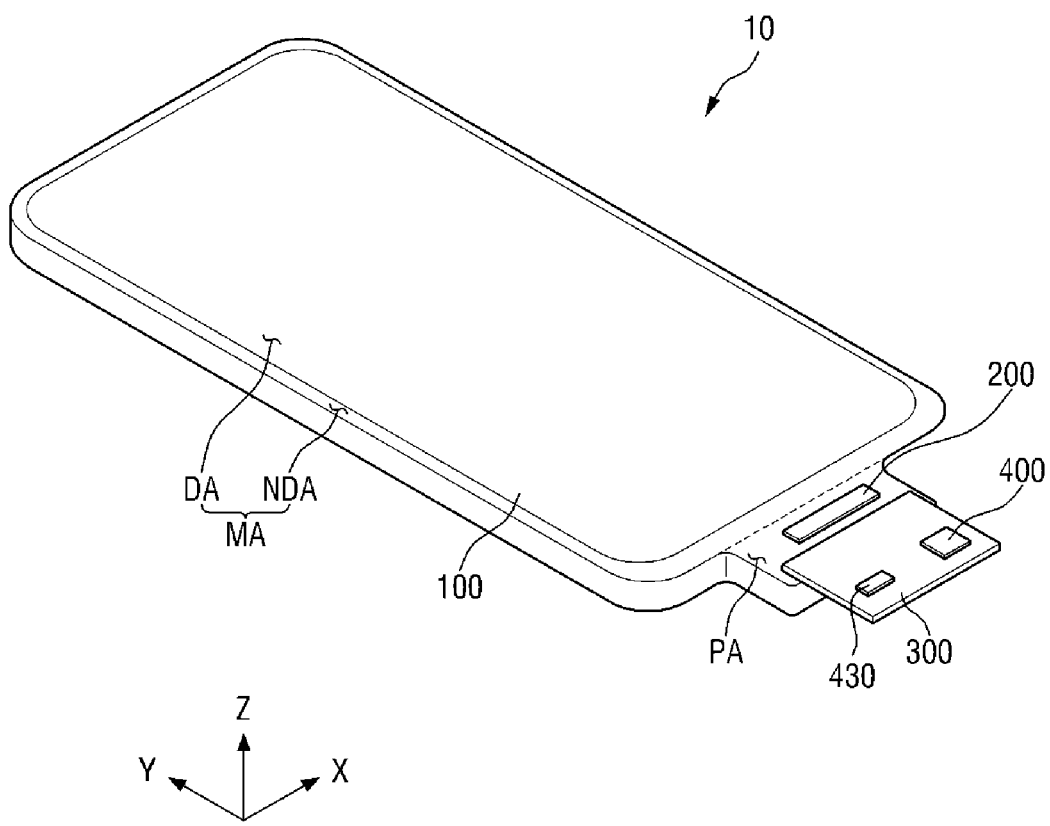
FIG. 1 is a perspective view of a display device according to an embodiment.

The invention will now be described more fully hereinafter with reference to the accompanying drawings, in which various embodiments are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. The phrase "at least one of" modifying listed elements means "at least one selected from" the listed elements. "Or" means "and/or." As used herein, the term "and/or" includes any and all combinations of one or more of the associated listed items. It will be further understood that the terms "comprises" and/or "comprising," or "includes" and/or"including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Hereinafter, for convenience of description, embodiments where a display device 10 is an organic light emitting display device using organic light emitting elements as light emitting elements will be described in detail, but the disclosure is not limited to this case. Alternatively, the display device 10 may be an inorganic light emitting display device using micro-light emitting diodes or inorganic semiconductors (inorganic light emitting diodes) as light emitting elements, for example.

Figure 2:
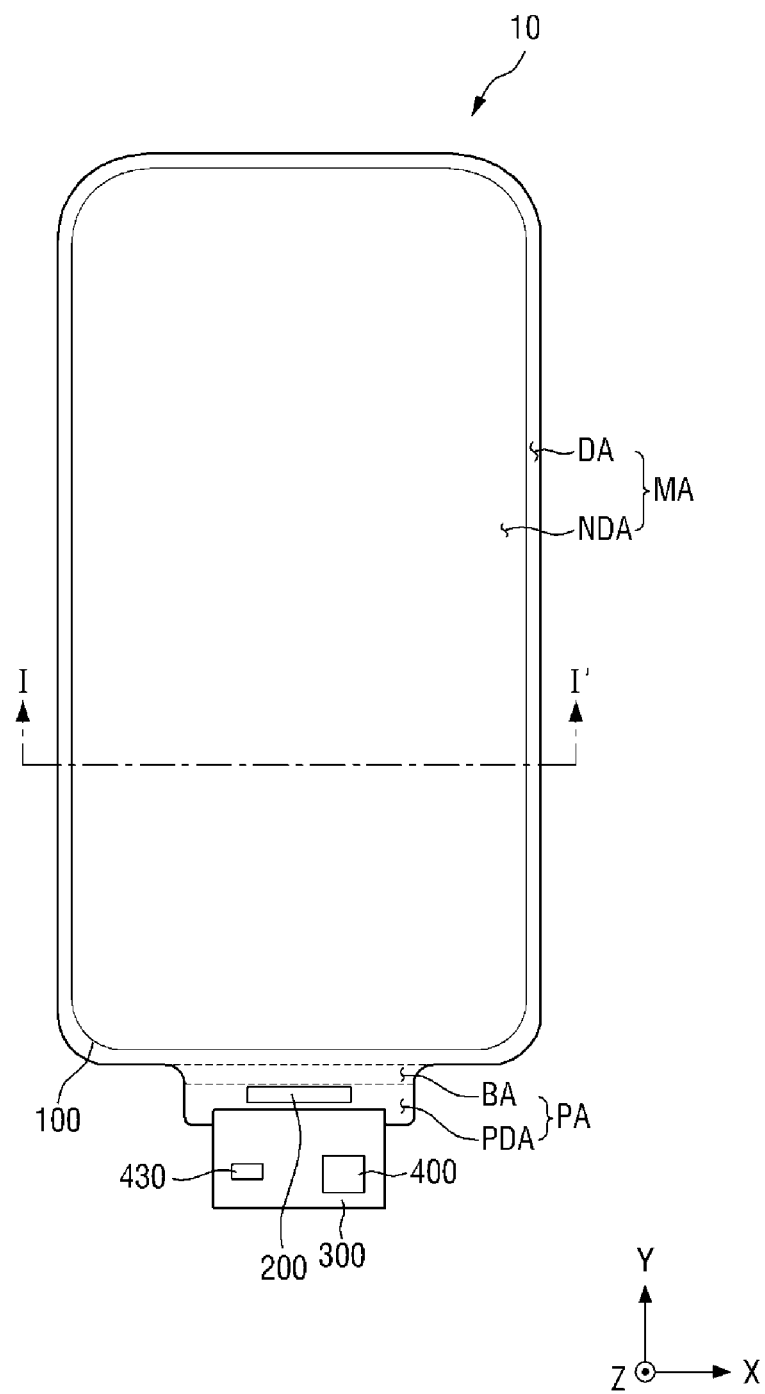
FIG. 2 is a plan view of the display device according to an embodiment.

FIG. 1 is a perspective view of a display device 10 according to an embodiment. FIG. 2 is a plan view of the display device 10 according to the embodiment.

In the specification, the terms "above", "top" and "upper surface" indicate an upward direction from a display panel 100, that is, a Z-axis direction, and the terms "below," "bottom" and "lower surface" indicate a downward direction from the display panel 100, that is, a direction opposite to the Z-axis direction. In addition. "left," "right," "upper" and "lower" indicate directions when the display panel 100 is viewed in a plan view. For example, "left" indicates a direction opposite to an X-axis direction, "right" indicates the X-axis direction, "upper" indicates a Y-axis direction, and "lower" indicates a direction opposite to the Y-axis direction.

Referring to FIGS. 1 and 2, an embodiment of the display device 10 is a device that displays moving images or still images. The display device 10 may be used as a device that define a display screen of portable electronic devices, such as mobile phones, smartphones, tablet personal computers ("PC"s), smart watches, watch phones, mobile communication terminals, electronic notebooks, electronic books, portable multimedia players ("PMP"s), navigation devices and ultra-mobile PCs ("UMPC"s), as well as display screens of various products such as televisions, notebook computers, monitors, billboards and the Internet of things ("IoT"). The display device 10 may be anyone of an organic light emitting display device, a liquid crystal display device, a plasma display device, a field emission display device, an electrophoretic display device, an electrowetting display device, a quantum-dot light emitting display device, and a micro-light emitting diode ("LED") display device. Hereinafter, embodiments where the display device 10 is an organic light emitting display device will be described in detail, but embodiments are not limited thereto.

An embodiment of the display device 10 includes the display panel 100, a display driver circuit 200, a circuit board 300, a touch driving circuit 400, and a vibration driving circuit 430.

The display panel 100 may include a main area MA and a protruding area PA protruding from a side of the main area MA.

The main area MA may be in a shape of a rectangular plane having short sides in a first direction (X-axis direction) and long sides in a second direction (Y-axis direction) intersecting the first direction (X-axis direction). Each corner where a short side extending in the first direction (X-axis direction) meets a long side extending in the second direction (Y-axis direction) may be rounded with a predetermined curvature or may be right-angled. The planar shape of the display device 10 is not limited to a quadrilateral shape, and alternatively, the planar shape of the display device 10 may be one of another polygonal shape, a circular shape, or an elliptical shape. The main area MA may be flat. However, embodiments are not limited thereto, and alternatively, the main area MA may include curved portions formed at left and right ends of a flat portion. In such an embodiment, the curved portions may have a constant curvature or a varying curvature.

The main area MA may include a display area DA where pixels are disposed to display an image and a non-display area NDA disposed around the display area DA.

In an embodiment, not only the pixels, but also scan lines, data lines and a power supply line connected to the pixels may be disposed in the display area DA. In an embodiment, where the main area MA includes a curved portion, the display area DA may be disposed in the curved portion. In such an embodiment, an image of the display panel 100 may be displayed in the curved portion.

Figure 4:
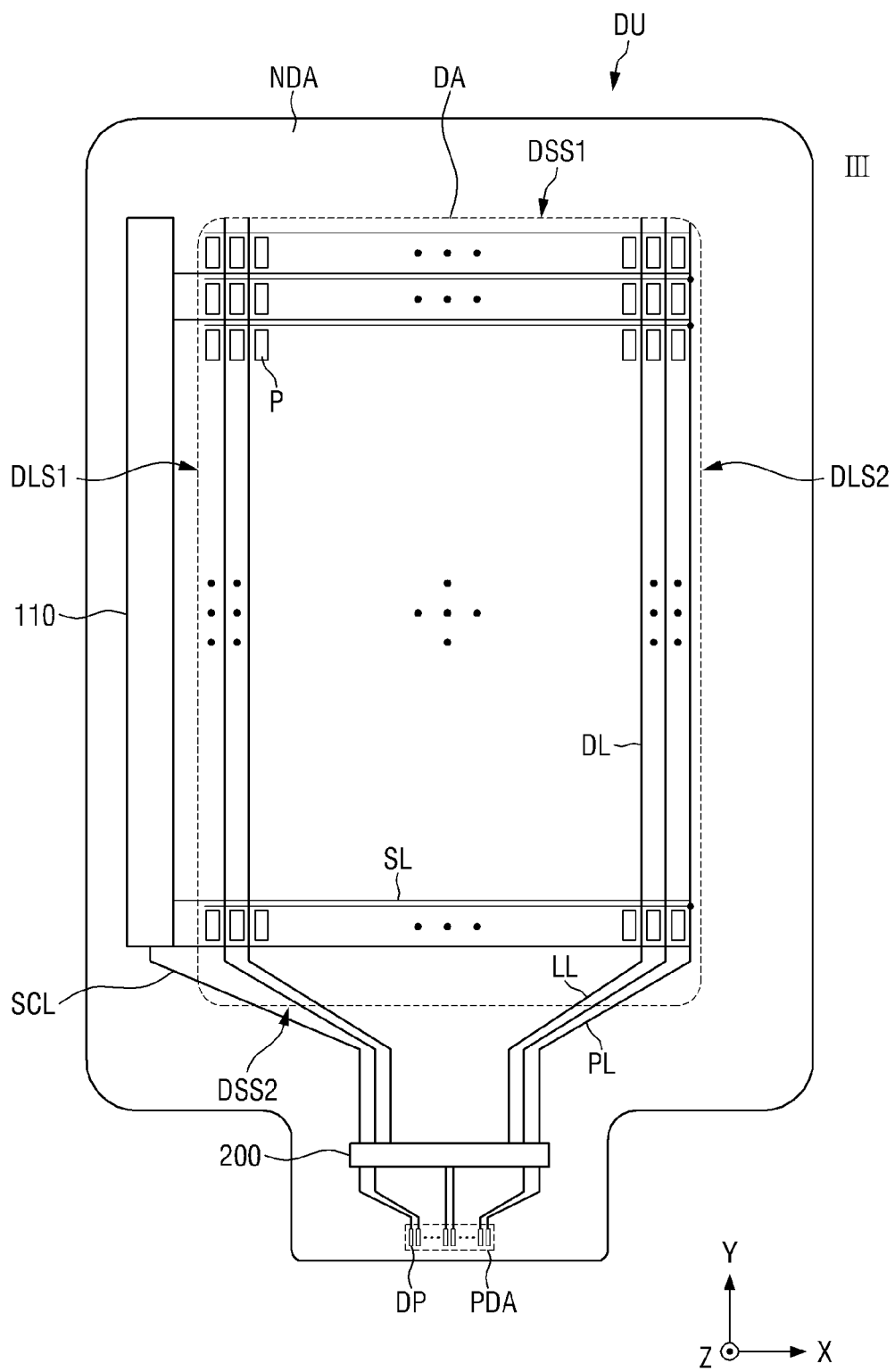
FIG. 4 illustrates an embodiment of a display unit of FIG. 3.

The non-display area NDA may be defined as an area extending from the outside of the display area DA to edges of the display panel 100. In an embodiment, as shown in FIG. 4, a scan driver 110 for applying scan signals to the scan lines and link lines for connecting the data lines and the display driver 200 may be disposed in the non-display area NDA of the main area MA.

The protruding area PA may protrude from a side of the main area MA. In one embodiment, for example, the protruding area PA may protrude from a lower side of the main area MA as illustrated in FIG. 2. A length of the protruding area PA in the first direction (X-axis direction) may be smaller than a length of the main area MA in the first direction (X-axis direction).

In an embodiment, the protruding area PA may include a bending area BA and a pad area PDA. In such an embodiment, the pad area PDA may be disposed on a side of the bending area BA, and the main area MA may be disposed on the other side of the bending area BA. In one embodiment, for example, the pad area PDA may be disposed on a lower side of the bending area BA, and the main area MA may be disposed on an upper side of the bending area BA.

The display panel 100 may be flexible such that the display panel 100 may be curved, bent, folded, or rolled. Therefore, the display panel 100 may be bent in the bending area BA in a direction opposite to a third direction (Z-axis direction). In such an embodiment, a surface of the pad area PDA of the display panel 100 which faces upward before the display panel 100 is bent may face downward after the display panel 100 is bent. Therefore, the pad area PDA may be disposed under the main area MA to overlap the main area MA.

Pads electrically connected to the display driver circuit 200 and the circuit board 300 may be disposed on the pad area PDA of the display panel 100.

The display driver circuit 200 outputs signals and voltages for driving the display panel 100. In one embodiment, for example, the display driver circuit 200 may supply data voltages to the data lines. In an embodiment, the display driver circuit 200 may supply a power supply voltage to the power supply line and supply scan control signals to the scan driver 110. The display driver circuit 200 may be formed as an integrated circuit and mounted on the display panel 100 in the pad area PDA by a chip-on-glass ("COG") method, a chip-on-plastic ("COP") method, or an ultrasonic bonding method. However, embodiments are not limited thereto. In one embodiment, for example, the display driver circuit 200 may be mounted on the circuit board 300.

The pads may include display pads electrically connected to the display driver circuit 200, touch pads electrically connected to touch lines, and vibration pads electrically connected to vibration lines.

The circuit board 300 may be attached onto the pads on the pad area PDA of the display panel 100 via an anisotropic conductive film. Therefore, lead lines of the circuit board 300 may be electrically connected to the pads. The circuit board 300 may be a flexible printed circuit board, a printed circuit board, or a flexible film such as a chip-on-film.

In an embodiment, the touch driving circuit 400 may be connected to touch electrodes of a touch detection unit TDU of the display panel 100. The touch driving circuit 400 applies driving signals to the touch electrodes of the touch detection unit TDU and measures capacitance values of the touch electrodes. Each of the driving signals may be a signal having a plurality of driving pulses. Based on the capacitance values, the touch driving circuit 400 may not only determine whether a touch input has been made, but also calculate touch coordinates of the touch input. In such an embodiment, the touch driving circuit 400 may transmit a touch coordinate signal to the vibration driving circuit 430.

The vibration driving circuit 430 may generate vibrations in a vibration generating unit VU based on the touch coordinate signal received from the touch driving circuit 400. In one embodiment, for example, the vibration driving circuit 430 may generate vibrations by contracting and expanding a vibration generating layer corresponding to an area indicated by the touch coordinate signal by applying driving voltages to vibration electrodes of the vibration generating unit VU. In such an embodiment, since a different area of the vibration generating unit VU vibrates based on the touch coordinate signal, power consumption may be reduced while haptic sensitivity is improved.

The touch driving circuit 400 and the vibration driving circuit 430 may be disposed on the circuit board 300. In one embodiment, for example, the touch driving circuit 400 may be formed as integrated circuits and mounted on the circuit board 300. In an embodiment, the touch driving circuit 400 and the vibration driving circuit 430 may be integrally formed in (or defined by portions of) a single integrated circuit.

Figure 3:
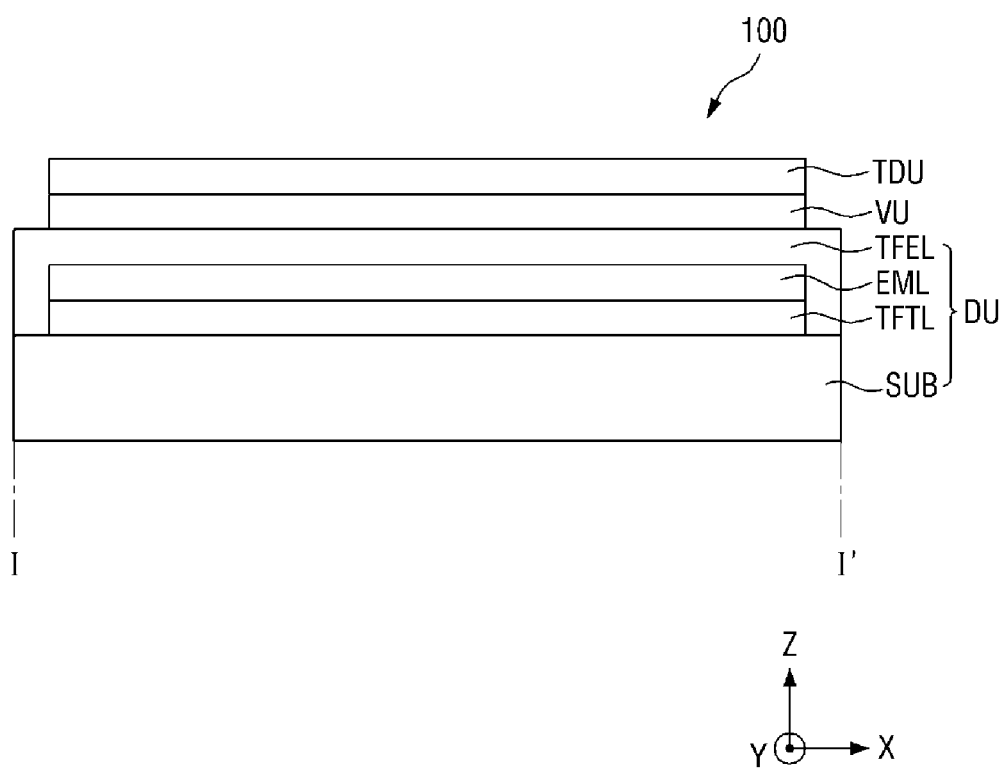
FIG. 3 is a cross-sectional view take along line I-I' of FIG. 2.

FIG. 3 is a cross-sectional view taken along line I-I' of FIG. 2.

Referring to FIG. 3, in an embodiment, the display panel 100 may include a display unit DU including a substrate SUB, a thin-film transistor layer TFTL disposed on the substrate SUB, a light emitting element layer EML and a thin-film encapsulation layer TFEL, the vibration generating unit VU disposed on the display unit DU, and the touch detection unit TDU. In an embodiment, the touch detection unit TDU may be disposed on the display unit DU, and the vibration generating unit VU may be disposed on the touch detection unit TDU.

The substrate SUB may include or be made of an insulating material such as a glass, quartz, or a polymer material. The polymer material may be, for example, polyethersulfone ("PES"), polyacrylate ("PA"), polyarvlate ("PAR"), polyetherimide ("PEI"), polyethylene naphthalate ("PEN"), polyethylene terepthalate ("PET"), polyphenylene sulfide ("PPS"), polyallylate, polyimide ("PI"), polycarbonate ("PC"), cellulose triacetate ("CAT"), cellulose acetate propionate ("CAP"), or a combination thereof. Alternatively, the substrate SUB may include a metal material.

The substrate SUB may be a rigid substrate or a flexible substrate that may be bent, folded, and rolled. In an embodiment, where the substrate SUB is a flexible substrate, the substrate SUB may include or be made of, but not limited to, PI.

The thin-film transistor layer TFTL may be disposed on the substrate SUB. In the thin-film transistor layer TFTL, not only respective thin-film transistors of pixels, but also scan lines, data lines, power supply lines, scan control lines, and routing lines for connecting pads and the data lines may be disposed or formed. Each of the thin-film transistors may include a gate electrode, a semiconductor layer, a source electrode, and a drain electrode. In an embodiment, where the scan driver 110 is formed in the non-display area NDA of the display panel 100 as illustrated in FIG. 4, the scan driver 110 may include thin-film transistors.

The thin-film transistor layer TFTL may be disposed in the display area DA and the non-display area NDA. In an embodiment, the respective thin-film transistors of the pixels, the scan lines, the data lines, and the power supply lines of the thin-film transistor layer TFTL may be disposed in the display area DA. The scan control lines and the routing lines of the thin-film transistor layer TFTL may be disposed in the non-display area NDA.

The light emitting element layer EML may be disposed on the thin-film transistor layer TFTL. The light emitting element layer EML may include the pixels, and each of the pixels includes a first electrode, a light emitting layer and a second electrode, and a pixel defining layer that defines the pixels. The light emitting layer may be an organic light emitting layer including an organic material. In this case, the light emitting layer may include a hole transporting layer, an organic light emitting layer, and an electron transporting layer. When a predetermined voltage is applied to the first electrode and a cathode voltage is applied to the second electrode through a thin-film transistor of the thin-film transistor layer TFTL, holes and electrons move to the organic light emitting layer respectively through the hole transporting layer and the electron transporting layer and combine together in the organic light emitting layer, thereby emitting light. The pixels of the light emitting element layer EML may be disposed in the display area DA.

The thin-film encapsulation layer TFEL may be disposed on the light emitting element layer EML. The thin-film encapsulation layer TFEL prevents oxygen or moisture from penetrating into the light emitting element layer EML. In such an embodiment, the thin-film encapsulation layer TFEL may include at least one inorganic layer. The inorganic layer may be, but is not limited to, a silicon nitride layer, a silicon oxynitride layer, a silicon oxide layer, a titanium oxide layer, or an aluminum oxide layer. In an embodiment, the thin-film encapsulation layer TFEL protects the light emitting element layer EML from foreign substances such as dust. In such an embodiment, the thin-film encapsulation layer TFEL may include at least one organic layer. The organic layer may be, but is not limited to, acryl resin, epoxy resin, phenolic resin, polyamide resin, or PI resin.

The thin-film encapsulation layer TFEL may be disposed in both the display area DA and the non-display area NDA. In an embodiment, the thin-film encapsulation layer TFEL may cover the light emitting element layer EML of the display area DA and the non-display area NDA, and may cover the thin-film transistor layer TFTL of the non-display area NDA.

The vibration generating unit VU may be disposed on the thin-film encapsulation layer TFEL. The vibration generating unit VU may include vibration electrodes and vibration layers disposed between the vibration electrodes. In an embodiment, as described above, when driving voltages are applied to the vibration electrodes, the vibration layers may contract and expand in response to the driving voltages, thereby generating vibrations. The vibration layers may include a ferroelectric polymer. In one embodiment, for example, the vibration layers may include or be made of polyvinylidene fluoride ("PVDF").

The vibration electrodes and the vibration layers of the vibration generating unit VU may be defined by patterned area. Accordingly, although the vibration generating unit VU is disposed on the entire surface of the display unit DU, the vibration generating unit VU may generate vibrations on an area basis. However, embodiments are not limited thereto, and alternatively, the vibration generating unit VU may also be disposed on not the entire surface of the display unit DU, but only a part of the display unit DU. The patterning of the vibration electrodes and the vibration layers by area will be described later in greater detail.

The touch detection unit TDU may be disposed on the vibration generating unit VU. The touch detection unit TDU may include touch electrodes for sensing a touch thereon using a capacitance method and touch lines for connecting the touch electrodes. In one embodiment, for example, the touch detection unit TDU may sense a touch thereon using a self-capacitance method or a mutual capacitance method.

Figure 9:
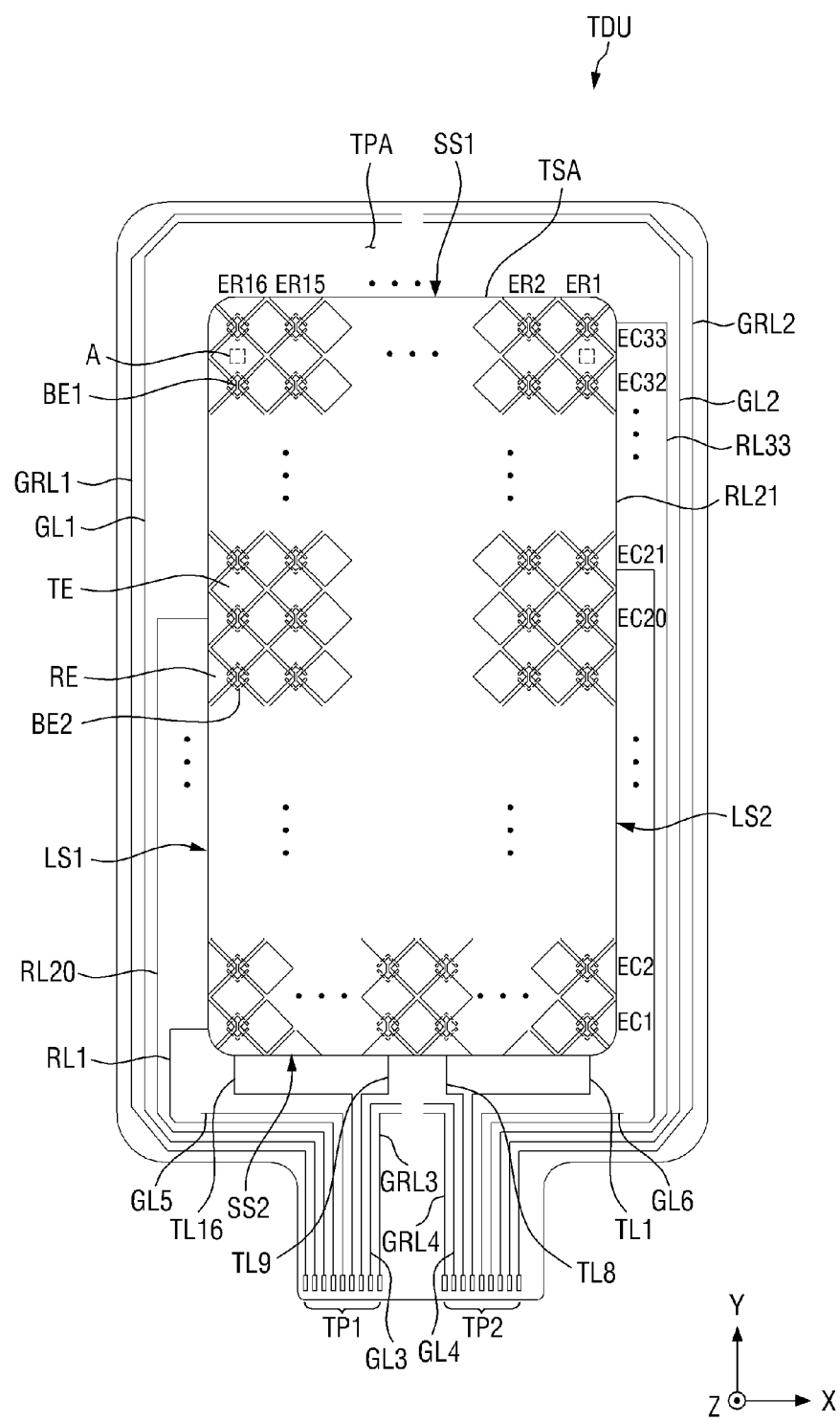
FIG. 9 illustrates an embodiment of a touch sensing unit of FIG. 3.

The touch electrodes of the touch detection unit TDU may be disposed in a touch sensor area TSA overlapping the display area DA as illustrated in FIG. 9. The touch lines of the touch detection unit TDU may be disposed in a touch peripheral area TPA overlapping the non-display area NDA as illustrated in FIG. 9.

In an embodiment, although not illustrated, a protective layer may be disposed on the touch detection unit TDU. The protective layer may include, for example, a window member. The protective layer may be attached onto the touch detection unit TDU by an optically clear adhesive ("OCA"). In an embodiment, the display device 10 may further include an optical member. In one embodiment, for example, an optical member such as a polarizing film may be interposed between the touch detection unit TDU and the protective layer 500.

In an embodiment, the touch detection unit TDU may be disposed on the display unit DU, and the vibration generating unit VU may be disposed on the touch detection unit TDU. In such an embodiment, the touch detection unit TDU may be disposed directly on the thin-film encapsulation layer TFEL of the display unit DU. In an embodiment, the vibration generating unit VU may be disposed under the display unit DU. In such embodiments, the stacking relationship of the display unit DU, the touch detection unit TDU, and the vibration generating unit VU may be variously changed or modified.

FIG. 4 illustrates an embodiment of the display unit DU of FIG. 3.

In FIG. 4, only pixels P, scan lines SL, data lines DL, a power supply line PL, scan control lines SCL, the scan driver 110, the display driver circuit 200, and display pads DP of the display unit DU are illustrated for ease of description.

Referring to FIG. 4, an embodiment of the display unit DU may include the display area DA and the non-display area NDA as described above. In such an embodiment, the display area DA may include a first display short side DSS1 and a second display short side DSS2 which extend in the first direction (X-axis direction) and face each other in the second direction (Y-axis direction) and a first display long side DLS1 and a second display long side DLS2 which extend in the second direction (Y-axis direction) intersecting the first direction (X-axis direction) and face each other in the first direction (X-axis direction). In an embodiment, corners where the first display long side DLS1 and the second display long side DLS2 meet the first display short side DSS1 and the second display short side DSS2 may be rounded with a constant curvature. However, embodiments are not limited thereto. In an alternative embodiment, the corners where the first display long side DLS1 and the second display long side DLS2 meet the first display short side DSS1 and the second display short side DSS2 may be cut.

The scan lines SL, the data lines DL, the power supply line PL, and the pixels P are disposed in the display area DA. The scan lines SL may extend parallel to each other in the first direction (X-axis direction), and the data lines DL may extend parallel to each other in the second direction (Y-axis direction) intersecting the first direction (X-axis direction). The power supply line PL may include at least one line extending parallel to the data lines DL in the second direction (Y-axis direction) and a plurality of lines branching from the at least one line in the first direction (X-axis direction).

Each of the pixels P may be connected to at least any one of the scan lines SL, any one of the data lines DL, and the power supply line PL. Each of the pixels P may include thin-film transistors including a driving transistor and at least one switching transistor, an organic light emitting diode, and a capacitor. Each of the pixels P may receive a data voltage of a data line DL in response to a scan signal applied thereto from a scan line SL and may emit light by supplying a driving current to the organic light emitting diode based on the data voltage applied to a gate electrode.

The scan driver 110 is connected to the display driver circuit 200 by at least one scan control line SCL. Therefore, the scan driver 110 may receive a scan control signal of the display driver circuit 200. The scan driver 110 may generate scan signals according to the scan control signal and supply the scan signals to the scan lines SL.

In an embodiment, as shown in FIG. 4, the scan driver 110 may be disposed or formed in the non-display area NDA on a left side of the display area DA, but embodiments are not limited thereto. In an alternative embodiment, the scan driver 110 may be formed in the non-display area NDA on left and right sides of the display area DA.

The display driver circuit 200 may be connected to the display pads DP disposed in the pad area PDA to receive digital video data and timing signals. The display driver circuit 200 converts the digital video data into analog positive/negative data voltages and supplies the data voltages to the data lines DL through link lines LL. In such an embodiment, the display driver circuit 200 generates a scan control signal for controlling the scan driver 110 and supplies the generated scan control signal to the scan driver 110 through the scan control lines SCL. Pixels P to be supplied with the data voltages are selected by the scan signals of the scan driver 110, and the data voltages are supplied to the selected pixels P. The display driver circuit 200 may be formed as an integrated circuit and attached onto the substrate SUB by COG method, a COP method, or an ultrasonic bonding method.

Figure 5:
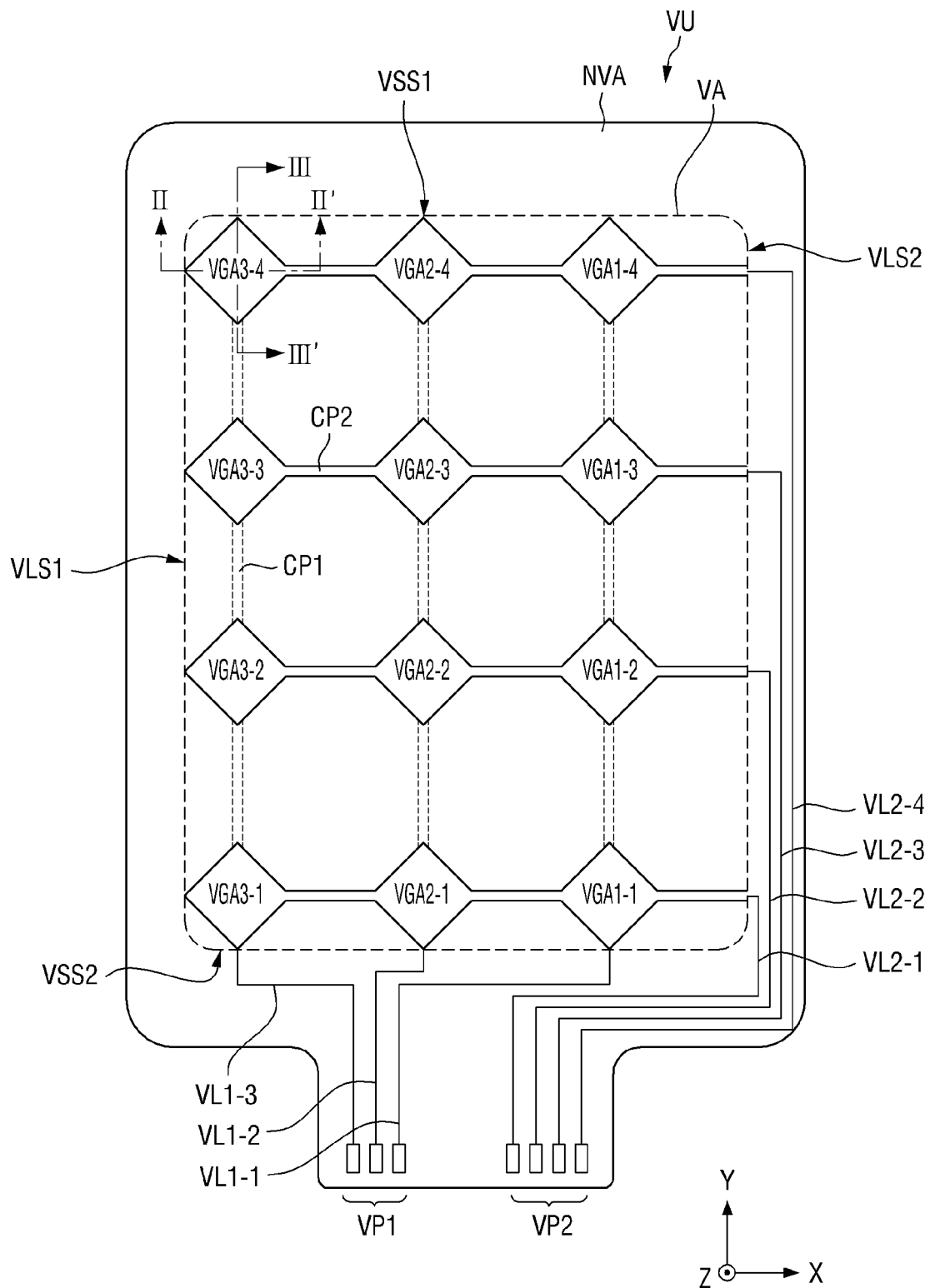
FIG. 5 illustrates an embodiment of a vibration generating unit of FIG. 3.
Figure 6:
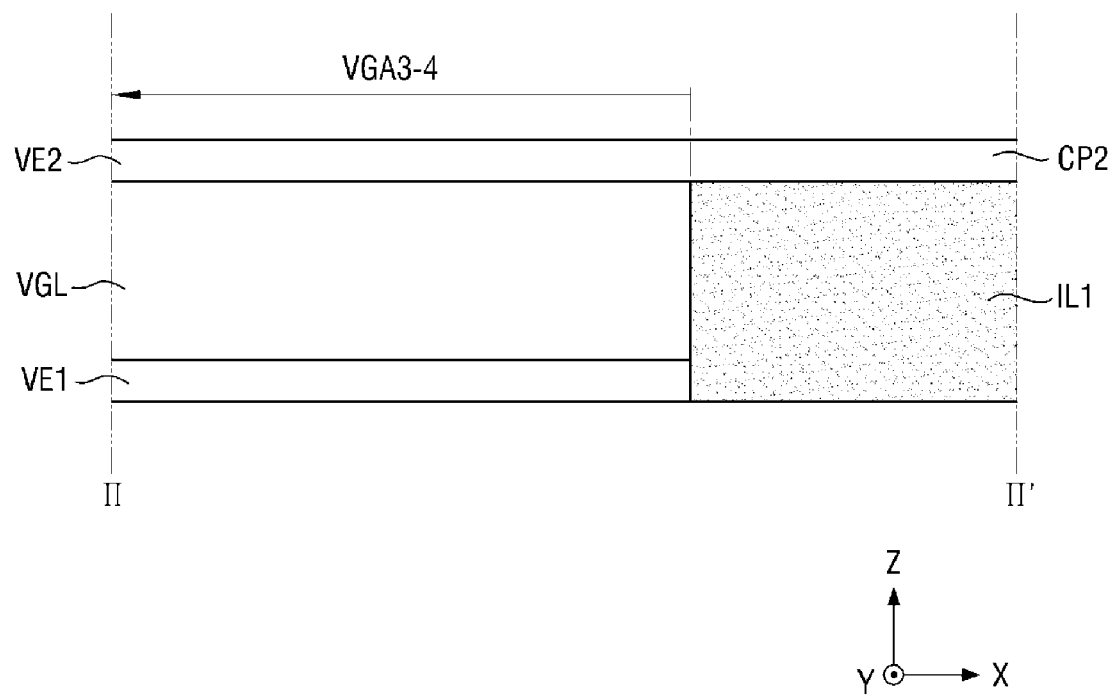
FIG. 6 is a cross-sectional view taken along II-II' of FIG. 5.
Figure 7:
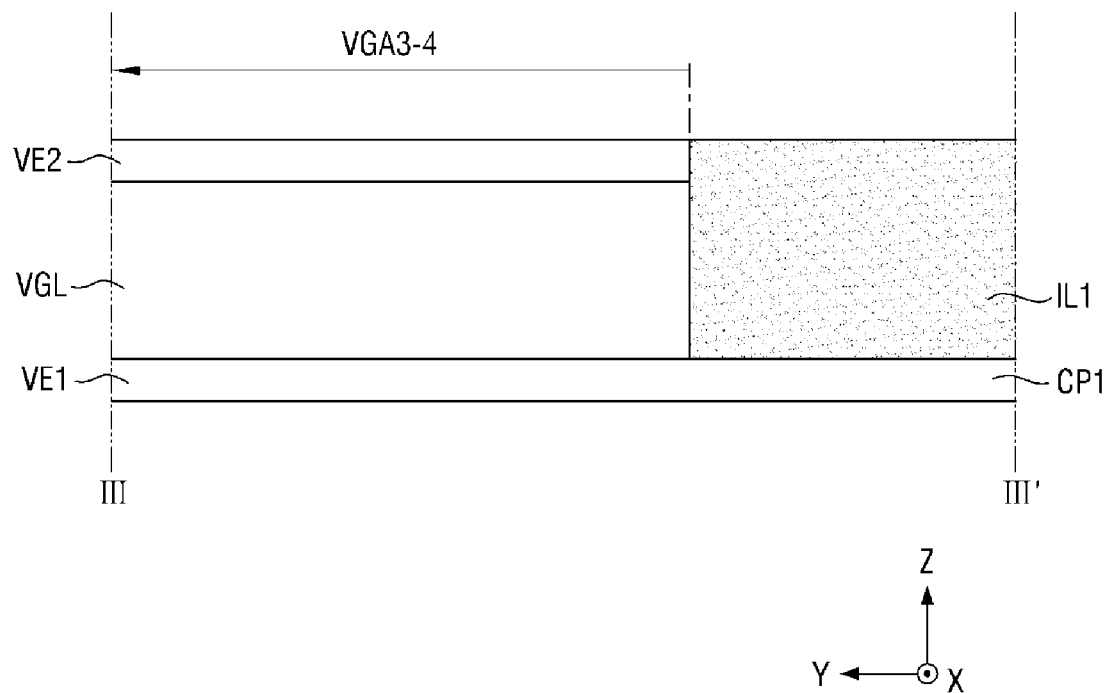
FIG. 7 is a cross-sectional view taken along III-III' of FIG. 5.
Figure 8:
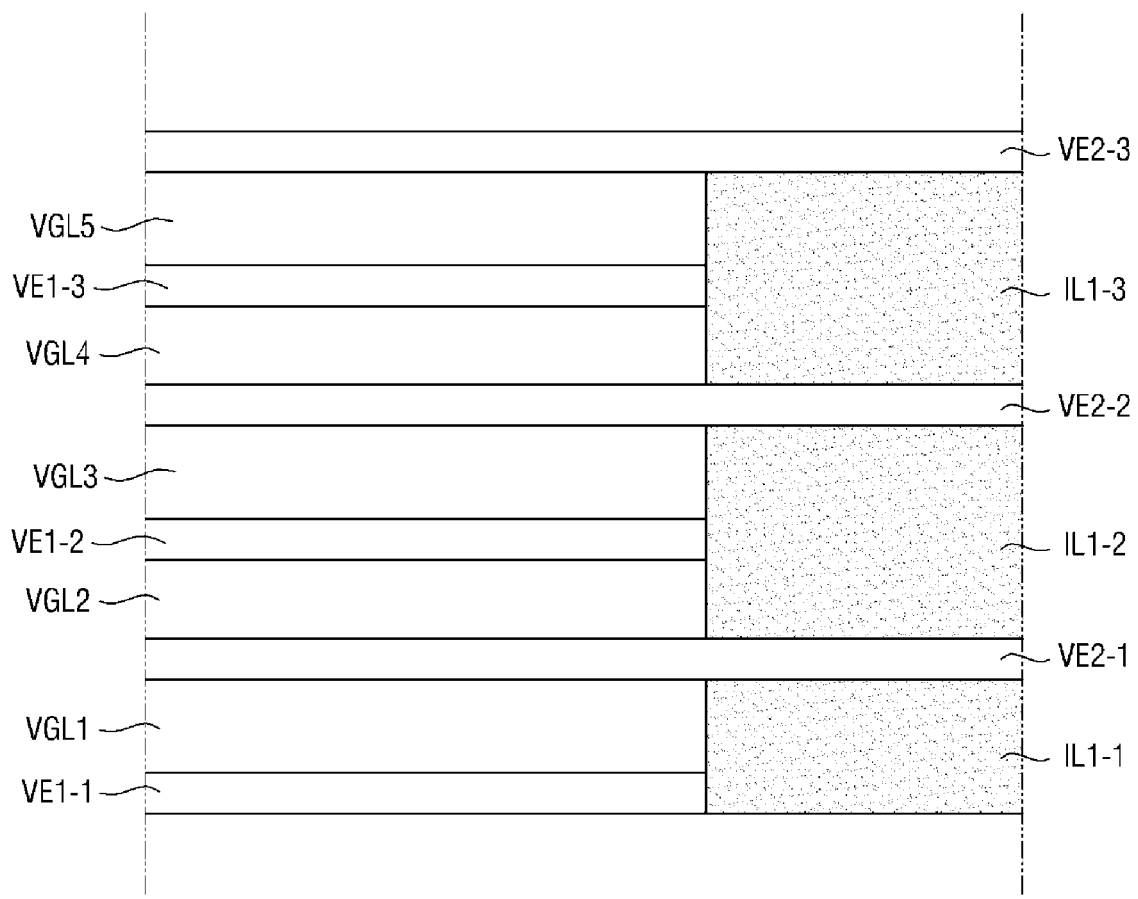
FIG. 8 is a cross-sectional view of an embodiment of a vibration area.
Figure 10:
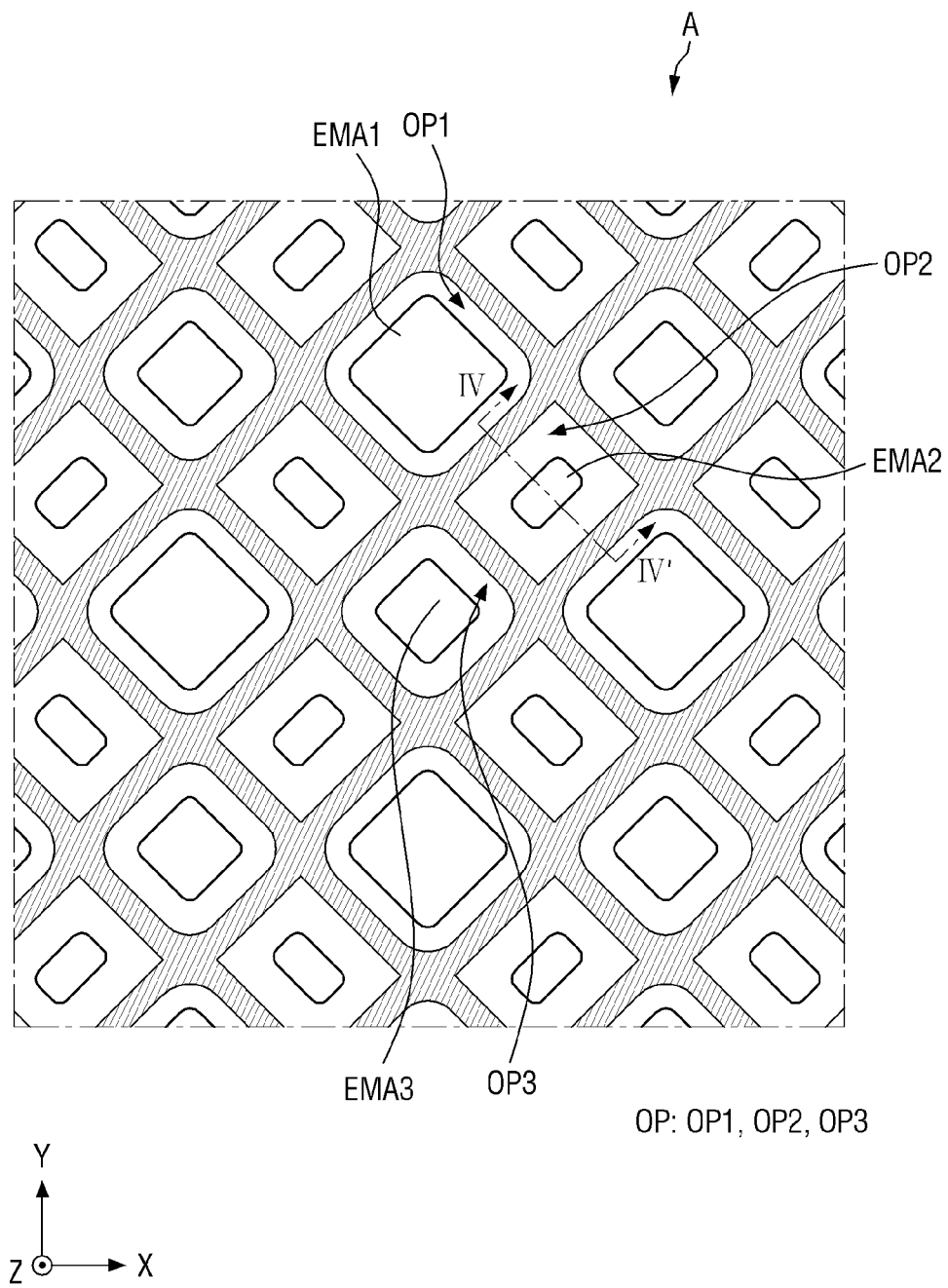
FIG. 10 is a schematic enlarged view of area A of FIG. 9.
Figure 11:
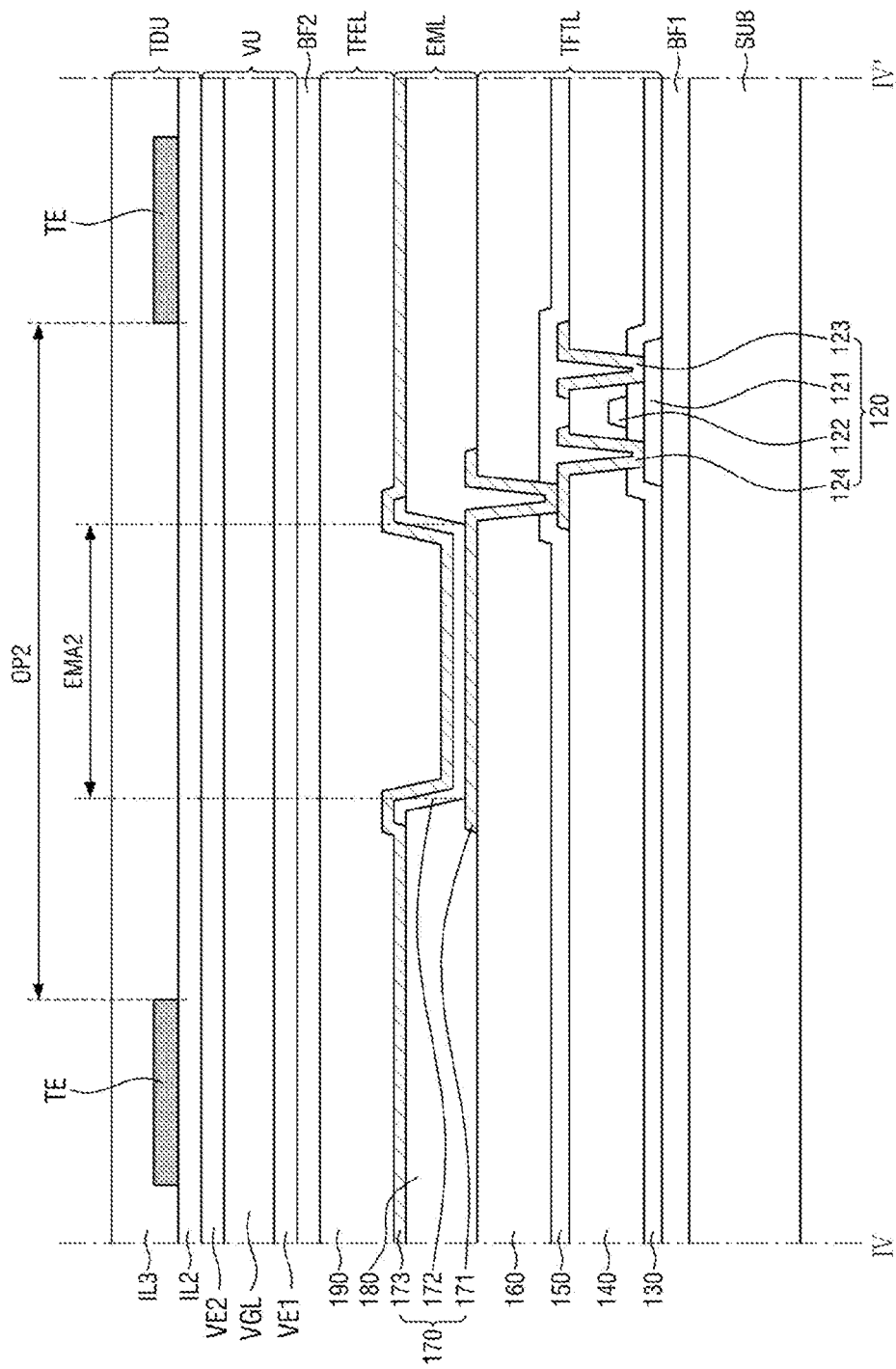
FIG. 11 is a cross-sectional view taken along IV-IV' of FIG. 10.
Figure 12:
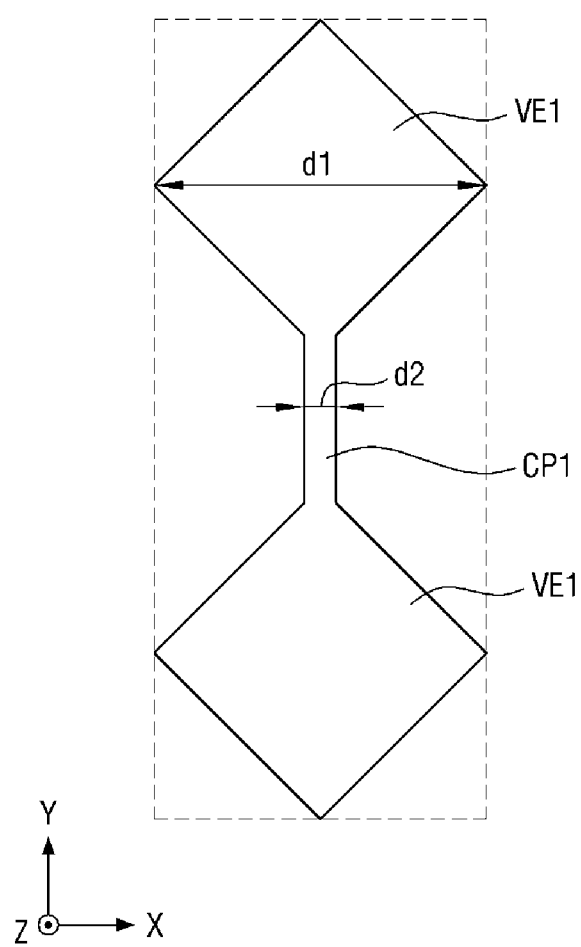
FIG. 12 schematically illustrates first vibration electrodes and a first connection pattern according to an embodiment.
Figure 13:
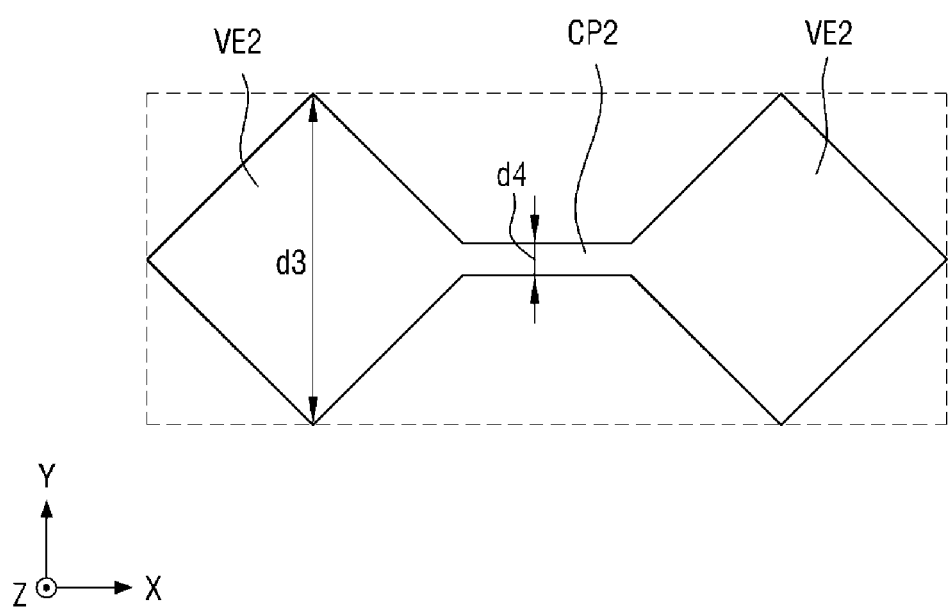
FIG. 13 schematically illustrates second vibration electrodes and a second connection pattern according to an embodiment.
Figure 16:
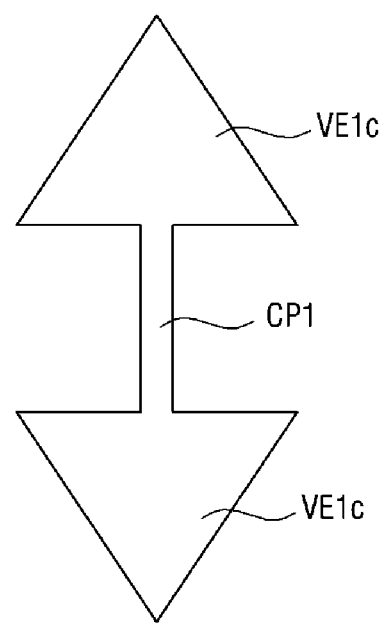
Figure 17:
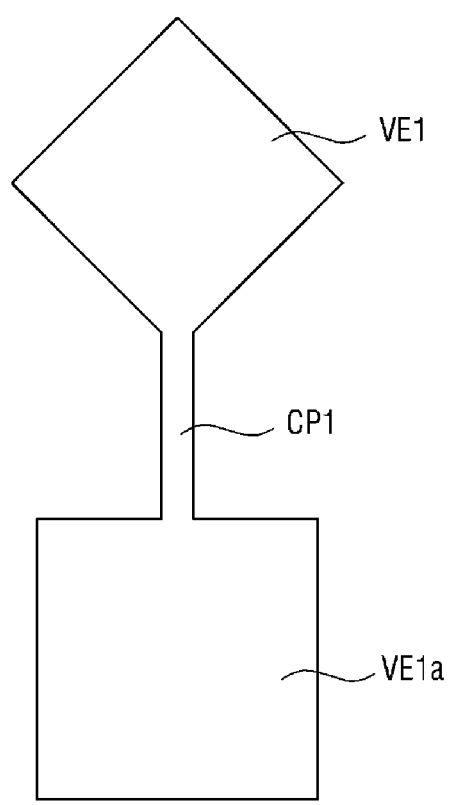
Figure 18:
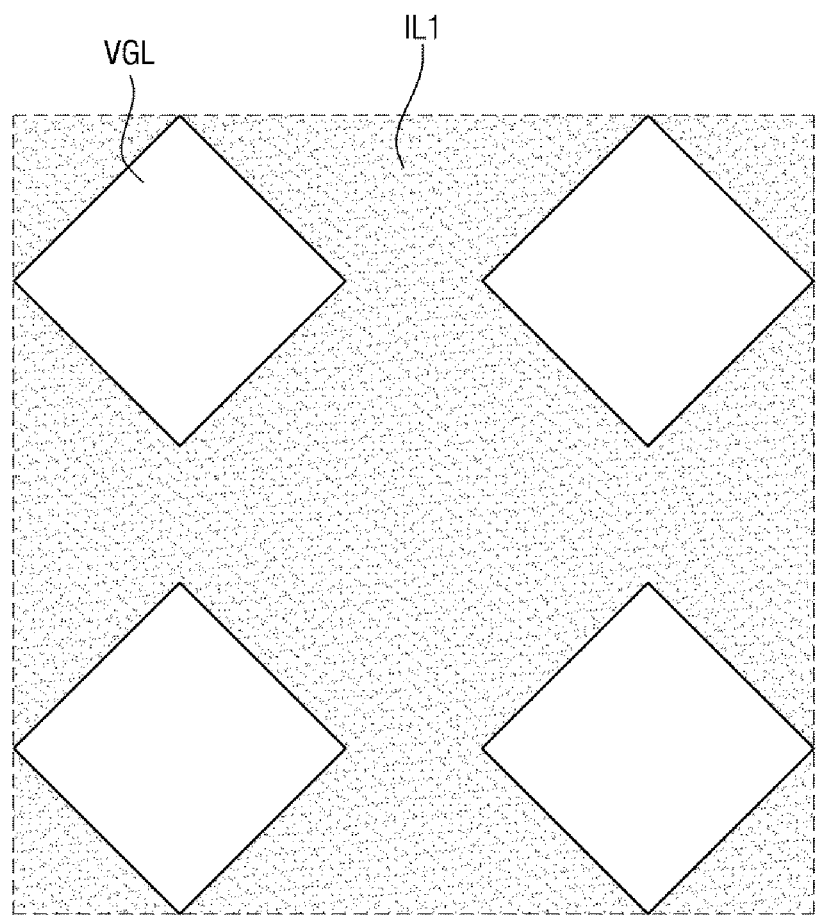
FIG. 18 schematically illustrates the shape of vibration layers according to an embodiment.

FIG. 5 illustrates an embodiment of the vibration generating unit VU of FIG. 3. FIG. 6 is across-sectional view taken along II-II' of FIG. 5. FIG. 7 is a cross-sectional view taken along III-III' of FIG. 5. FIG. 8 is a cross-sectional view of an embodiment of a vibration area VA. FIG. 9 illustrates an embodiment of the touch detection unit TDU of FIG. 3. FIG. 10 is a schematic enlarged view of area A of FIG. 9. FIG. 11 is a cross-sectional view taken along IV-IV' of FIG. 10. FIG. 12 schematically illustrates first vibration electrodes VE1 and a first connection pattern CP1 according to an embodiment FIG. 13 schematically illustrates second vibration electrodes VE2 and a second connection pattern CP2 according to an embodiment FIGS. 14 through 17 schematically illustrate shapes of vibration electrodes according to embodiments. FIG. 18 schematically illustrates the shape of vibration layers VGL according to an embodiment.

Referring to FIGS. 5 through 8, an embodiment of the vibration generating unit VU may include the vibration area VA in which first vibration electrodes VE1, second vibration electrodes VE2, and vibration layers VGL are disposed and a non-vibration area NVA surrounding the vibration area VA. In such an embodiment, the vibration area VA may overlap the display area DA of the display unit DU, and the non-vibration area NVA may overlap the non-display area NDA of the display unit DU.

In an embodiment, the vibration area VA may include a first vibration short side VSS1 and a second vibration short side VSS2 which extend in the first direction (X-axis direction) and face each other in the second direction (Y-axis direction) and include a first vibration long side VLS1 and a second vibration long side VLS2 which extend in the second direction (Y-axis direction) intersecting the first direction (X-axis direction) and face each other in the first direction (X-axis direction). Corners where the first vibration long side VLS1 and the second vibration long side VLS2 meet the first vibration short side VSS1 and the second vibration short side VSS2 may be rounded with a constant curvature. However, embodiments are not limited thereto. In an alternative embodiment, the corners where the first vibration long side VLS1 and the second vibration long side VLS2 meet the first vibration short side VSS1 and the second vibration short side VSS2 may be cut. In an embodiment, the four sides that form the vibration area VA may all have a same length as each other.

In an embodiment, the first vibration short side VSS1 and the first display short side DSS1 may overlap each other and may have substantially a same length as each other. The second vibration short side VSS2 and the second display short side DSS2 may overlap each other and may have substantially a same length as each other. The first vibration long side VLS1 and the first display long side DLS1 may overlap each other and may have substantially a same length as each other. The second vibration long side VLS2 and the second display long side DLS2 may overlap each other and may have substantially a same length as each other. However, depending on an area where a haptic function is to be implemented in the display device 10, the first vibration short side VSS1, the second vibration short side VSS2, the first vibration long side VLS1 and the second vibration long side VSS2 that form the vibration area VA may also have different lengths from the first display short side DSS1, the second display short side DSS2, the first display long side DLS1 and the second display long side DLS2 of the display area DA, respectively, and the vibration area VA and the display area DA may also have different shapes from each other.

The vibration electrodes VE1 and VE2 and the vibration layers VGL may be disposed in the vibration area VA.

The vibration electrodes VE1 and VE2 may include the first vibration electrodes VE1 and the second vibration electrodes VE2. In one embodiment, for example, in the vibration area VA, three first vibration electrodes VE1 may be arranged in the first direction (X-axis direction), and four first vibration electrodes VE1 may be arranged in the second direction (Y-axis direction). That is, the first vibration electrodes VE1 may be arranged in a matrix form with four rows and three columns. In an embodiment, the second vibration electrodes VE2 may overlap the first vibration electrodes VE1 in the third direction (Z-axis direction). In one embodiment, for example, in the vibration area VA, three second vibration electrodes VE2 may be arranged in the first direction (X-axis direction), and fourth second vibration electrodes VE2 may be arranged in the second direction (Y-axis direction). However, this is merely exemplary, and embodiments are not limited thereto.

The first vibration electrodes VE1 and the second vibration electrodes VE2 may include or be made of a conductive material. In an embodiment, the first vibration electrodes VE1 and the second vibration electrodes VE2 may include or be made of a transparent conductive material to secure the transmittance of the vibration generating unit VU. In one embodiment, for example, the first vibration electrodes VE1 and the second vibration electrodes VE2 may include or be made of a transparent conductive material such as indium tin oxide ("ITO") or silver-nanowires (AgNWs). In an alternative embodiment, the first vibration electrodes VE1 and the second vibration electrodes VE2 may be defined by metal meshes. In such an embodiment, the first vibration electrodes VE1 and the second vibration electrodes VE2 may be metal meshes in which a metal material is disposed in a mesh form. Thus, the first vibration electrodes VE1 and the second vibration electrodes VE2 may substantially function as transparent electrodes. In an embodiment, the first vibration electrodes VE1 and the second vibration electrodes VE2 may include or be made of a same material as each other. However, embodiments are not limited thereto, and alternatively, the first vibration electrodes VE1 and the second vibration electrodes VE2 may include or be made of different materials from each other.

Referring to FIG. 12, in an embodiment, the first vibration electrodes VE1 may be connected to each other in the second direction (Y-axis direction). In one embodiment, for example, the first vibration electrodes VE1 may be electrically connected to each other by a first connection pattern CP1 extending in the second direction (Y-axis direction). The first connection pattern CP1 may include or be formed of a same material and in a same layer as the first vibration electrodes VE1, but embodiments are not limited thereto. A width d1 of each of the first vibration electrodes VE1 in the first direction (X-axis direction) may be greater than a width d2 of the first connection pattern CP1 in the first direction (X-axis direction). The first connection pattern CP1 may connect adjacent first vibration electrodes VE1 in the second direction (Y-axis direction) to each other. In an embodiment, a vibration layer VGL may not be disposed on the first connection pattern CP, but a first insulating layer IL may be disposed on the first connection pattern CP as illustrated in FIG. 7. Alternatively, the vibration layer VGL may extend onto a part of the first connection pattern CP1.

Referring to FIG. 13, in an embodiment, the second vibration electrodes VE2 may be connected to each other in the first direction (X-axis direction). In one embodiment, for example, the second vibration electrodes VE2 may be electrically connected to each other by a second connection pattern CP2 extending in the first direction (X-axis direction). The second connection pattern CP2 may include or be formed of a same material and in a same layer as the second vibration electrodes VE2, but embodiments are not limited thereto. A width d3 of each of the second vibration electrodes VE2 in the second direction (Y-axis direction) may be greater than a width d4 of the second connection pattern CP2 in the second direction (Y-axis direction). The second connection pattern CP2 may connect adjacent second vibration electrodes VE2 in the first direction (X-axis direction). In an embodiment, a vibration layer VGL may not be disposed under the second connection pattern CP2, but the first insulating layer IL1 may be disposed under the second connection pattern CP2 as illustrated in FIG. 6. Alternatively, the vibration layer VGL may extend to under a part of the second connection pattern CP2.

The first insulating layer IL1 may include an organic material or an inorganic material. In one embodiment, for example, the first insulating layer IL may include at least any one organic material selected from acrylic resin, methacrylic resin, polyisoprene, vinyl resin, epoxy resin, urethane resin, cellulose resin, siloxane resin, PI resin, polyamide resin and perylene resin, or may include at least any one inorganic material selected from silicon nitride, silicon oxynitride, silicon oxide, titanium oxide and aluminum oxide.

Figure 14:
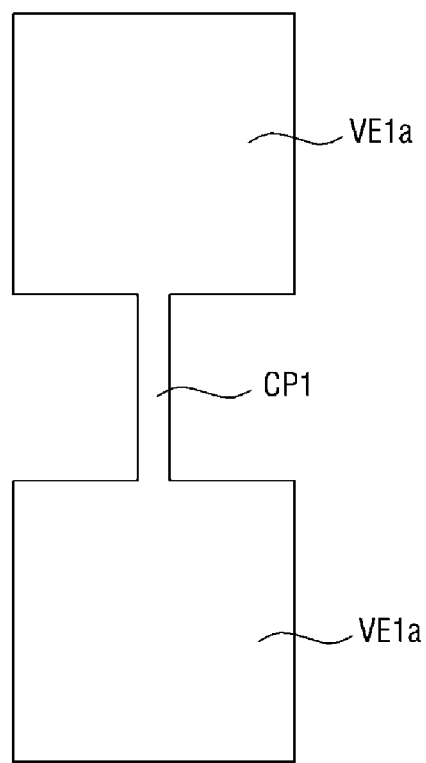
FIGS. 14 through 17 schematically illustrate shapes of vibration electrodes according to embodiments.
Figure 15:
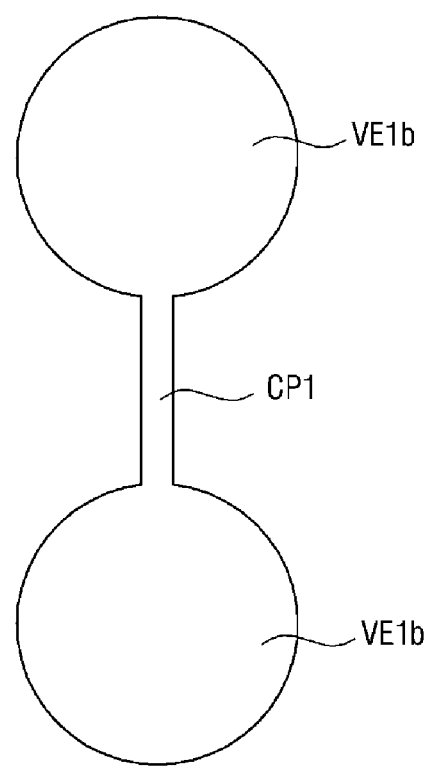

The vibration electrodes VE1 and VE2 may be rhombic. However, the shapes of the vibration electrodes VE1 and VE2 are not limited thereto and may be modified or changed to be in one of various shapes. In one embodiment, for example, where the first vibration electrodes VE1, first vibration electrodes VE1a have square shape as illustrated in FIG. 14, first vibration electrodes VE1b may be circular as illustrated in FIG. 15, and first vibration electrodes VE1c may be triangular as illustrated in FIG. 16. The first vibration electrodes VE1 may have different shapes from each other. In one embodiment, for example, the first vibration electrodes VE1 may have a combination of a rhombic shape and a square shape as illustrated in FIG. 17.

In an embodiment, the first vibration electrodes VE1 and the second vibration electrodes VE2 may have a same shape as each other. Alternatively, the first vibration electrodes VE1 and the second vibration electrodes VE2 may have different shapes and have different areas and thicknesses from each other. In an embodiment, the vibration electrodes VE1 and VE2 may have a mesh structure with a plurality of openings.

The vibration layers VGL may be disposed between the first vibration electrodes VE1 and the second vibration electrodes VE2, respectively. In one embodiment, for example, the vibration layers VGL may overlap the first vibration electrodes VE1 and the second vibration electrodes VE2 in the third direction (Z-axis direction) and may contact the first vibration electrodes VE1 and the second vibration electrodes VE2, respectively.

The first insulating layer IL1 may be disposed in an area where the first vibration electrodes VE1 and the second vibration electrodes VE2 are not disposed. The first insulating layer IL1 may separate the vibration layers VGL from each other as illustrated in FIG. 18. In such an embodiment, the vibration layers VGL may be disposed in areas defined through the first insulating layer IL 1. However, embodiments are not limited thereto, and alternatively, the vibration layers VGL may also overlap the connection patterns CP1 and CP2. In such an embodiment, the vibration layers VGL may be connected to each other. In an embodiment, the vibration layers GL may be divided into different groups and vibration layers GL in a same group may be connected to each other. Since the vibration layers VGL are patterned by the first insulating layer IL1 as described above, a plurality of vibration generating areas may be provided. The vibration generating areas may vibrate individually or independently of each other, thus reducing power consumption while improving haptic characteristics.

In an embodiment, each of the first vibration electrodes VE1, the second vibration electrodes VE2, and the vibration layers VGL may have a multilayer structure. Referring to FIG. 8, a first first vibration electrode VE1-1 may be disposed, a first vibration layer VGL1 may be disposed on the first first vibration electrode VE1-1, and a first second vibration electrode VE2-1 may be disposed on the first vibration layer VGL1. In such an embodiment, a second vibration layer VGL2 may be disposed on the first second vibration electrode VE2-1, and a second first vibration electrode VE1-2 may be disposed on the second vibration layer VGL2. In such an embodiment, a third vibration layer VGL3 may be disposed on the second first vibration electrode VE1-2, and a second second vibration electrode VE2-2 may be disposed on the third vibration layer VGL3. In such an embodiment, a fourth vibration layer VGL4 may be disposed on the second second vibration electrode VE2-2, and a third first vibration electrode VE1-3 may be disposed on the fourth vibration layer VGL4. In such an embodiment, a fifth vibration layer VGL5 may be disposed on the third first vibration electrode VE1-3, and a third second vibration electrode VE2-3 may be disposed on the fifth vibration layer VGL5. However, embodiments are not limited thereto, and the stacking structure of the first vibration electrodes VE1, the second vibration electrodes VE2 and the vibration layers VGL may be variously changed or modified. In such an embodiment, a first first insulating layer IL1-1 may be disposed under the first second vibration electrode VE2-1, a second first insulating layer IL 1-2 may be disposed between the first second vibration electrode VE2-1 and the second second vibration electrode VE2-2, and a third first insulating layer IL1-3 may be disposed between the second second vibration electrode VE2-2 and the third second vibration electrode VE2-3. In an embodiment, where the first vibration electrodes VE1, the second vibration electrodes VE2 and the vibration layers VGL are formed as multilayers as described above, the vibration of the vibration generating unit VU may be increased.

Referring back to FIG. 5, in an embodiment, a plurality of vibration generating areas may be located in the vibration area VA. The vibration generating areas are defined by areas where the first vibration electrodes VE1, the vibration layers VGL, and the second vibration electrodes VE2 overlap each other. In one embodiment, for example, the vibration generating areas may include first first through fourth third vibration generating areas VGA1-1 through VGA3-4, and the first first through fourth third vibration generating areas VGA1-1 through VGA3-4 may be separated from each other.

The vibration layers VGL may include or be made of an insulating elastic material such as silicon, acryl or urethane or a piezoelectric polymer material such as PVDF or lead zirconate titanate ("PZT") (a generic term for a solid solution of zirconate ($PbZrO_3$) and titanate ($PbTlO_3$)). The vibration layers VGL may include or be made of PVDF. In an embodiment, where the vibration layers VGL are made of PVDF, the vibration layers VGL may be easily manufactured in the form of flexible films because PVDF contains polyvinylidene fluoride trifluoroethylene ("PVDF-TrFE").

The first and second vibration electrodes VE1 and VE2 may be attached to opposing surfaces of the vibration layers VGL, respectively, and the first and second vibration electrodes VE1 and VE2 may receive voltages from the vibration driving circuit 430. Accordingly, an alignment direction of dipoles of the vibration layers VGL may be changed, thereby vibrating the vibration generating unit VU.

Vibration lines may be disposed in the non-vibration area NVA and may be electrically connected to the first and second vibration electrodes VE1 and VE2.

In an embodiment, first vibration lines VL1-1 through VL1-3 are connected to first vibration electrodes VE1 closest to the second vibration short side VSS2 among the first vibration electrodes VE1 electrically connected in the second direction (Y-axis direction) by the first connection patterns CP1. In one embodiment, for example, one end of a first first vibration line VL1-1 may be connected to a first vibration electrode VE1 disposed in the first first vibration generating area VGA1-1. Accordingly, first vibration electrodes VE1 respectively disposed in the first first vibration generating area VGA1-1, the second first vibration generating area VGA1-2, the third first vibration generating area VGA1-3 and the fourth first vibration generating area VGA1-4 may be connected to the first first vibration line VL1-1. The other end of the first first vibration line VL1-1 may be connected to a first vibration pad VP1.

One end of a second first vibration line VL1-2 may be connected to a first vibration electrode VE1 disposed in the first second vibration generating area VGA2-1. Accordingly, first vibration electrodes VE1 respectively disposed in the first second vibration generating area VGA2-1, the second second vibration generating area VGA2-2, the third second vibration generating area VGA2-3 and the fourth second vibration generating area VGA2-4 may be connected to the second first vibration line VL1-2. The other end of the second first vibration line VL1-2 may be connected to a first vibration pad VP1.

One end of a third first vibration line VL1-2 may be connected to a first vibration electrode VE1 disposed in the first third vibration generating area VGA3-1. Accordingly, first vibration electrodes VE1 respectively disposed in the first third vibration generating area VGA3-1, the second third vibration generating area VGA3-2, the third third vibration generating area VGA3-3 and the fourth third vibration generating area VGA3-4 may be connected to the third first vibration line VL1-3. The other end of the third first vibration line VL1-3 may be connected to a first vibration pad VP1.

Second vibration lines VL2-1 through VL2-4 are connected to second vibration electrodes VE2 closest to the second vibration long side VLS2 among the second vibration electrodes VE2 electrically connected in the first direction (Y-axis direction) by the second connection patterns CP2. In one embodiment, for example, one end of a first second vibration line VL2-1 may be connected to a second vibration electrode VE2 disposed in the first first vibration generating area VGA1-1. Accordingly, second vibration electrodes VE2 respectively disposed in the first first vibration generating area VGA1-1, the first second vibration generating area VGA2-1 and the first third vibration generating area VGA3-1 may be connected to the first second vibration line VL2-1. The other end of the first second vibration line VL2-1 may be connected to a second vibration pad VP2.

One end of a second second vibration line VL2-2 may be connected to a second vibration electrode VE2 disposed in the second first vibration generating area VGA1-2. Accordingly, second vibration electrodes VE2 respectively disposed in the second first vibration generating area VGA1-2, the second second vibration generating area VGA2-2 and the second third vibration generating area VGA3-2 may be connected to the second second vibration line VL2-2. The other end of the second second vibration line VL2-2 may be connected to a second vibration pad VP2.

One end of a third second vibration line VL2-3 may be connected to a second vibration electrode VE2 disposed in the third first vibration generating area VGA1-3. Accordingly, second vibration electrodes VE2 respectively disposed in the third first vibration generating area VGA1-3, the third second vibration generating area VGA2-3 and the third third vibration generating area VGA3-3 may be connected to the third second vibration line VL2-3. The other end of the third second vibration line VL2-3 may be connected to a second vibration pad VP2.

One end of a fourth second vibration line VL2-4 may be connected to a second vibration electrode VE2 disposed in the fourth first vibration generating area VGA1-4. Accordingly, second vibration electrodes VE2 respectively disposed in the fourth first vibration generating area VGA1-4, the fourth second vibration generating area VGA2-4 and the fourth third vibration generating area VGA3-4 may be connected to the fourth second vibration line VL2-4. The other end of the fourth second vibration line VL2-4 may be connected to a second vibration pad VP2.

Since the first first through fourth third vibration generating areas VGA1-1 through VGA3-4 generate vibrations when voltages are applied to the first vibration electrodes VE1 and the second vibration electrodes VE2 disposed in the first first through fourth third vibration generating areas VGA1-1 through VGA3-4, respectively, the first vibration lines VL1-1 through VL1-3 may be connected to the first vibration electrodes VE1 electrically connected in the second direction (Y-axis direction) by the first connection patterns CP1, and the second vibration lines VL2-1 through VL2-4 may be connected to the second vibration electrodes VE2 electrically connected in the first direction (X-axis direction) by the second connection patterns CP2. Therefore, it is possible to generate vibrations in a specific area among the first first through fourth third vibration generating areas VGA-1 through VGA3-4 by adjusting voltages applied to the first vibration lines VL1-1 through VL1-3 and the second vibration lines VL2-1 through VL2-4, in an embodiment, the vibration driving circuit 430 may receive touch coordinates from the touch driving circuit 400 and generate vibrations in an area corresponding to a touch area by applying a voltage to the area, thereby reducing power consumption while improving haptic characteristics.

In an embodiment, the first and second vibration electrodes VE1 and VE2 may be larger in area than first touch electrodes TE and second touch electrode RE to be described later. In one embodiment, for example, a plurality of first touch electrodes TE and a plurality of second touch electrodes RE may overlap each other in the third direction (Z-axis direction) within the area of the first and second vibration electrodes VE1 and VE2 overlapping in the third direction (Z-axis direction).

Referring to FIG. 9, the touch detection unit TDU includes the touch sensor area TSA for sensing a touch thereon and the touch peripheral area TPA disposed around the touch sensor area TSA. The touch sensor area TSA may overlap the vibration area VA of the vibration generating unit VU, and the touch peripheral area TPA may overlap the non-vibration area NVA of the vibration generating unit VU.

The touch sensor area TSA may include a first short side SS1 and a second short side SS2 which extend in the first direction (X-axis direction) and face each other in the second direction (Y-axis direction) and a first long side LS1 and a second long side LS2 which extend in the second direction (Y-axis direction) intersecting the first direction (X-axis direction) and face each other in the first direction (X-axis direction). Corners where the first long side LS1 and the second long side LS2 meet the first short side SS1 and the second short side SS2 may be rounded with a constant curvature. However, embodiments are not limited thereto. In an alternative embodiment, the corners where the first long side LS1 and the second long side LS2 meet the first short side SS1 and the second short side SS2 may be cut.

The first short side SS1 and the first vibration short side VSS1 may overlap each other and may have substantially a same length as each other. The second short side SS2 and the second vibration short side VSS2 may overlap each other and may have substantially a same length as each other. The first long side LS1 and the first vibration long side VLS1 may overlap each other and may have substantially a same length as each other. The second long side LS2 and the second vibration long side VLS2 may overlap each other and may have substantially a same length as each other. However, embodiments are not limited thereto. Depending on an area where a touch function is to be implemented in the display device 10, the first short side SS1, the second short side SS2, the first long side LS1 and the second long side LS2 that form the touch sensor area TSA may have different lengths from the first vibration short side VSS1, the second vibration short side VSS2, the first vibration long side VLS1 and the second vibration long side VLS2 of the vibration are VA, respectively, and the touch sensor area TSA and the vibration area VA may have different shapes from each other.

The touch electrodes TE and RE may be disposed in the touch sensor area TSA. The touch electrodes TE and RE may include the first touch electrodes TE and the second touch electrodes RE. One of the first touch electrodes TE and the second touch electrodes RE may be driving electrodes, and the other of the first touch electrodes TE and the second touch electrodes RE may be sensing electrodes. For convenience of description, an embodiment where the first touch electrodes TE are driving electrodes and the second touch electrodes RE are sensing electrodes will hereinafter be described in detail.

In the touch sensor area TSA, sixteen first touch electrodes TE may be arranged in the first direction (X-axis direction), and thirty-three second touch electrodes RE may be arranged in the second direction (Y-axis direction). In such an embodiment, the touch electrodes TE and RE may be disposed in thirty-three rows EC1 through EC33 and sixteen columns ER1 through ER16. The first touch electrodes TE may be disposed in the sixteen columns ER1 through ER16, and the second touch electrodes RE may be disposed in the thirty-three rows EC1 through EC33. However, this is merely exemplary, and embodiments are not limited thereto. The number and arrangement of the touch electrodes TE and RE disposed in the touch sensor area TSA are not limited to those described above, but may be variously modified.

The touch electrodes TE and RE may be rhombic. However, the shapes of the touch electrodes TE and RE are not limited thereto and may be changed to various shapes such as a triangle, a square, a pentagon, a circle, and a bar. In an embodiment, the first touch electrodes TE and the second touch electrodes RE have a same shape as each other as illustrated, but embodiments are not limited to this case. The first touch electrodes TE and the second touch electrodes RE may have different shapes from each other and may have different areas and thicknesses from each other. In an embodiment, the touch electrodes TE and RE may have a mesh structure with a plurality of openings.

The first touch electrodes TE may be electrically connected by first connection electrodes BE1 in the second direction (Y-axis direction), and the second touch electrodes RE may be electrically connected by second connection electrodes BE2 in the first direction (X-axis direction) intersecting the second direction (Y-axis direction).

In an embodiment, the first connection electrodes BE1 and the second connection electrodes BE2 may be disposed in different layers from each other to prevent the first touch electrodes TE and the second touch electrodes RE from short-circuiting at intersections of the first touch electrodes TE and the second touch electrodes RE. The stacked structure of the first touch electrodes TE, the second touch electrodes RE, the first connection electrodes BE1 and the second connection electrodes BE2 will be described later in greater detail.

Driving lines TL and sensing lines RL may be disposed in the touch peripheral area TPA. The driving lines TL may be electrically connected to the first touch electrodes TE, and the sensing lines RL may be electrically connected to the second touch electrodes RE. Specifically, the first touch electrodes TE are electrically connected to each other in the second direction (Y-axis direction). Therefore, driving lines TL1 through TL16 are connected to first touch electrodes TE disposed at one end of the first touch electrodes TE electrically connected in the second direction (Y-axis direction).

In an embodiment, the second touch electrodes RE are electrically connected to each other in the first direction (X-axis direction). Therefore, sensing lines RL1 through RL33 are connected to second touch electrodes RE disposed at one end or other end of the second touch electrodes RE electrically connected in the first direction (X-axis direction). In an embodiment, the sensing lines RL1 through RL33 may be disposed on a left side and a right side of the touch sensor area TSA.

A first guard line GL1 may be located between a first ground line GRL1 and a twentieth sensing line RL20 and may surround a part of a lower side, the left side and a part of an upper side of the touch sensor area TSA. A second guard line GL2 may be located between a second ground line GRL2 and a thirty-third sensing line RL33 and may surround a part of the lower side, the right side, and a part of the upper side of the touch sensor area TSA. one end each of the first guard line GL1 and the second guard line GL2 may face each other on the upper side of the touch sensor area TSA and may be spaced apart from each other in the first direction (X-axis direction).

A third guard line GL3 may be located between a third ground line GRL3 and a ninth driving line TL9 and may face a part of the lower side of the touch sensor area TSA. A fourth guard line GL4 may be located between a fourth ground line GRL4 and an eighth driving line TL8 and may face a part of the lower side of the touch sensor area TSA. A fifth guard line GL5 may be located between a first sensing line RL1 and a sixteenth driving line TL16, and a sixth guard line GL6 may be located between a twenty-first sensing line RL21 and a first driving line TL1.

The first ground line GRL1 may be located on a left side of the first guard line GL1 and may surround the first guard line GL1. The second ground line GRL2 may be disposed on a right side of the second guard line GL2 and may surround the second guard line GL2. The third ground line GRL3 may be connected to a rightmost first touch pad in a first touch pad portion TP1. The fourth ground line GRL4 may be connected to a leftmost second touch pad in a second touch pad portion TP2.

In an embodiment, the first ground line GRL1 and the second ground line GRL2 are disposed at outermost positions on a left side, an upper side and a right side of the touch detection unit TDU. The third ground line GRL3 and the fourth ground line GRL4 are disposed on a lower side of the touch detection unit TDU. Therefore, the touch sensor area TSA, the driving lines TL1 through TL16, and the sensing lines RL1 through RL33 may be surrounded by the first ground line GRL1, the second ground line GRL2, the third ground line GRL3, and the fourth ground line GRL4. Thus, static electricity applied from the outside may be discharged to the first ground line GRL1, the second ground line GRL2, the third ground line GRL3, and the fourth ground line GRL4. In such an embodiment, the touch sensor area TSA, the driving lines TL1 through TL16, and the sensing lines RL1 through RL33 may be protected from static electricity.

In such an embodiment, the first guard line GL1 may minimize the effect of a voltage change of the first ground line GRL1 on the first through twentieth sensing lines RL1 through RL20. The second guard line GL2 may minimize the effect of a voltage change of the second ground line GRL2 on the twenty-first through thirty-third sensing lines RL21 through RL33. The third guard line GL3 may minimize the effect of a voltage change of the third ground line GRL3 on the ninth through sixteenth driving lines TL9 through TL16. The fourth guard line GL4 may minimize the effect of a voltage change of the fourth ground line GRL4 on the first through eighth driving lines TL1 through TL8. The fifth guard line GL5 may minimize the effect of the first sensing line RL1 and the sixteenth driving line TL16 on each other. The sixth guard line GL6 may minimize the effect of the twenty-first sensing line RL21 and the first driving line TL1 on each other.

In such an embodiment, when the first touch electrodes TE and the second touch electrodes RE are driven using a mutual capacitance method, ground voltages may be applied to the first guard line GL1, the second guard line GL2, the third guard line GL3, the fourth guard line GL4, the fifth guard line GL5 and the sixth guard line GL6. In such an embodiment, when the first touch electrodes TE and the second touch electrodes RE are driven using a self-capacitance method, the same driving signals as the driving signals transmitted to the driving lines TL1 through TL16 and the sensing lines RL1 through RL33 may be transmitted to the first guard line GL1, the second guard line GL2, the third guard line GL3, the fourth guard line GL4, the fifth guard line GL5 and the sixth guard line GL6.

The ninth through sixteenth driving lines TL9 through TL16, the first through twentieth sensing lines RL1 through RL20, the first guard line GL1, the third guard line GL3, the fifth guard line GL5, the first ground line GRL1, and the third ground line GRL3 may be connected to the first touch pad portion TP1. In such an embodiment, the first through eighth driving lines TL1 through TL8, the twenty-first through thirty-third sensing lines RL21 through RL33, the second guard line GL2, the fourth guard line GL4, the sixth guard line GL6, the second ground line GRL2, and the fourth ground line GRL4 may be connected to the second touch pad portion TP2.

The ninth through sixteenth driving lines TL9 through TL16 may be disposed in the first touch pad portion TP1, and the first through eighth driving lines TL1 through TL8 may be disposed in the second touch pad portion TP2 such that the uniformity of wiring arrangement may be increased while effectively providing an area where the display pads DP described above are to be disposed. In such an embodiment, the first through sixteenth driving lines TL1 through TL16 have a single routing structure in which the first through sixteenth driving lines TL1 through TL16 are connected only to first touch electrodes TE of the first through sixteenth columns ER1 through ER16 disposed at a lower end of the touch sensor area TSA. Therefore, the touch peripheral area TPA may be reduced.

Referring to FIG. 10, light emitting areas EMA1 through EMA3 and the first touch electrodes TE are described above to describe the shapes and arrangement of the light emitting areas EMA1 through EMA3 and the touch electrodes TE and RE. In such an embodiment, the shapes and arrangement of the light emitting areas EMA1 through EMA3 and the second touch electrodes RE may be the same as those of the light emitting areas EMA1 through EMA and the first touch electrodes TE. In such an embodiment, as shown in FIG. 10, one vibration generating area may be disposed between the light emitting areas EMA1 through EMA3 and the touch electrodes TE and RE.

Referring to FIG. 10, a plurality of openings OP may be defined through a first touch electrode TE. The openings OP may include first through third openings OP1 through OP3. The first through third openings OP1 through OP3 may have different sizes from each other. In one embodiment, for example, the third openings OP3 may be smaller than the first openings OP1, and the second openings OP2 may be smaller than the third openings OP3. Alternatively, only one of the first through third openings OP1 through OP3 may have a different size from others thereof, or all of the first through third openings OP1 through OP3 may have a same size as each other.

First through third light emitting areas EMA1 through EMA3 may have different sizes. In one embodiment, for example, the third light emitting areas EMA3 may be smaller than the first light emitting areas EMA1, and the second light emitting areas EMA2 may be smaller than the third light emitting areas EMA3. The first through third light emitting areas EMA1 through EMA3 may be separated by the pixel defining layer to be described later. Here, a light emitting area may be defined as an area where light generated by a light emitting element 170 as illustrated in FIG. 11 is emitted out of the display unit DU.

In the display unit DU, the number of the first light emitting areas EMA1 and the number of the third light emitting areas EMA3 may be the same as each other. In the display unit DU, the number of the second light emitting areas EMA2 may be twice the number of the first light emitting areas EMA1 and twice the number of the third light emitting areas EMA3. In an embodiment, in the display unit DU, the number of the second light emitting areas EMA2 may be equal to the sum of the number of the first light emitting areas EMA1 and the number of the third light emitting areas EMA3.

The first light emitting areas EMA1 may output blue light, the second light emitting areas EMA2 may output green light, and the third light emitting areas EMA3 may output red light. However, embodiments are not limited thereto. In an alternative embodiment, fourth light emitting areas may be further provided. In an embodiment, the first through third light emitting areas EMA1 through EMA3 may output white light.

In an embodiment, as shown in FIG. 10, the light emitting areas EMA have a quadrilateral shape with rounded corners. However, the shapes of the light emitting areas EMA are not limited thereto and may be changed to have an octagonal shape, a circular shape, or other polygonal shapes.

The first through third openings OP1 through OP3 correspond to the first through third light emitting areas EMA1 through EMA3. In one embodiment, for example, the first openings OP1 of the first touch electrode TE may overlap the first light emitting areas EMA1 of the display unit DU in the third direction (Z-axis direction) which is a thickness direction, the second openings OP2 of the first touch electrode TE may overlap the second light emitting areas EMA2 of the display unit DU in the third direction (Z-axis direction), and the third openings OP3 of the first touch electrode TE may overlap the third light emitting areas EMA3 of the display unit DU in the third direction (Z-axis direction).

Since the first through third openings OP1 through OP3 overlap the first through third light emitting areas EMA1 through EMA3 in the third direction (Z-axis direction), light output from the display unit DU may be effectively output to the outside through the touch detection unit TDU. Accordingly, light loss may be minimized. In an embodiment, since an overlap area between the first touch electrode TE and a second electrode 173 (illustrated in FIG. 11) may be reduced, parasitic capacitance between the first touch electrode TE and the second electrode 173 may be reduced. The second touch electrodes RE may be substantially the same as the first touch electrodes TE, and thus any repetitive detailed description of the second touch electrodes RE is omitted.

In an embodiment, as described above, the first vibration electrodes VE1 and the second vibration electrodes VE2 of the vibration generating unit VU may include or be made of a transparent conductive material. In an embodiment, where the vibration generating unit VU is disposed between the display unit DU and the touch detection unit TDU or where the vibration generating unit VU is disposed on the touch detection unit TDU, light output from the display unit DU may be effectively output to the outside.

In an embodiment, the first vibration electrodes VE1 and the second vibration electrodes VE2 of the vibration generating unit VU may be defined by metal meshes. In such an embodiment, openings corresponding to the first through third openings OP1 through OP3 disposed in the touch detection unit TDU may be formed in the first vibration electrodes VE1 and the second vibration electrodes VE2 of the vibration generating unit VU.

Referring to FIGS. 10 and 11, the thin-film transistor layer TFTL is disposed on the substrate SUB. The thin-film transistor layer TFTL includes thin-film transistors 120, a gate insulating layer 130, an interlayer insulating film 140, a protective layer 150, and a planarization layer 160.

A first buffer layer BF1 may be disposed on a surface of the substrate SUB. The first buffer layer BF1 may be disposed on the surface of the substrate SUB to protect the thin-film transistors 120 and organic light emitting layers 172 of the light emitting element layer EML from moisture introduced through the substrate SUB which is vulnerable to moisture penetration. The first buffer layer BF1 may include or be composed of a plurality of inorganic layers stacked alternately. In one embodiment, for example, the first buffer layer BF1 may have a multilayer structure in which one or more inorganic layers selected from a silicon nitride layer, a silicon oxynitride layer, a silicon oxide layer, a titanium oxide layer, and an aluminum oxide layer are alternately stacked. Alternatively, the first buffer layer BF1 may be omitted.

The thin-film transistors 120 may be disposed on the first buffer layer BF. Each of the thin-film transistors 120 includes an active layer 121, a gate electrode 122, a source electrode 123, and a drain electrode 124. In an embodiment, as shown in FIG. 11, each of the thin-film transistors 120 is formed as a top-gate type in which the gate electrode 122 is located above the active layer 121, but not being limited thereto. Alternatively, each of the thin-film transistors 120 may also be formed as a bottom-gate type in which the gate electrode 122 is located under the active layer 121 or a double-gate type in which the gate electrode 122 is located both above and under the active layer 121.

The active layers 121 may be disposed on the first buffer layer BF. The active layers 121 may include polycrystalline silicon, monocrystalline silicon, low-temperature polycrystalline silicon, amorphous silicon, or an oxide semiconductor. In an embodiment, the oxide semiconductor may include binary compounds (ABx), ternary compounds (ABxCy) and quaternary compounds (ABxCyDz) containing indium, zinc, gallium, tin, titanium, aluminum, hafnium (Hf), zirconium (Zr), magnesium (Mg), etc. In one embodiment, for example, the active layers 121 may include indium tin zinc oxide ("ITZO") or I indium gallium zinc oxide ("IGZO"), for example. A light shielding layer may be disposed between the first buffer layer BF1 and the active layers 121 to block external light from entering the active layers 121.

The gate insulating layer 130 may be disposed on the active layers 121. The gate insulating layer 130 may be an inorganic layer, for example, a silicon nitride layer, a silicon oxynitride layer, a silicon oxide layer, a titanium oxide layer, or an aluminum oxide layer.

The gate electrodes 122 and gate lines may be disposed on the gate insulating layer 130. Each of the gate electrodes 122 and the gate lines may have a single layer structure or a multilayer structure including a layer made of any one or more of molybdenum (Mo), aluminum (Al), chromium (Cr), gold (Au), titanium (Ti), nickel (Ni), neodymium (Ne), copper (Cu), and a combination (e.g., an alloy) thereof.

The interlayer insulating film 140 may be disposed on the gate electrodes 122 and the gate lines. The interlayer insulating film 140 may be an inorganic layer, for example, a silicon nitride layer, a silicon oxynitride layer, a silicon oxide layer, a titanium oxide layer, or an aluminum oxide layer.

The source electrodes 123 and the drain electrodes 124 may be disposed on the interlayer insulating film 140. Each of the source electrodes 123 and the drain electrodes 124 may be connected to an active layer 121 through a contact hole defined through the gate insulating layer 130 and the interlayer insulating film 140. Each of the source electrodes 123 and the drain electrodes 124 may have a single layer structure or a multilayer structure including a layer made of any one or more of molybdenum (Mo), aluminum (Al), chromium (Cr), gold (Au), titanium (Ti), nickel (Ni), neodymium (Ne), copper (Cu), and a combination thereof.

The protective layer 150 for insulating the thin-film transistors 120 may be disposed on the source electrodes 123 and the drain electrodes 124. The protective layer 150 may be an inorganic layer, for example, a silicon nitride layer, a silicon oxynitride layer, a silicon oxide layer, a titanium oxide layer, or an aluminum oxide layer.

The planarization layer 160 may be disposed on the protective layer 150 to planarize steps due to the thin-film transistors 120. The planarization layer 160 may include or be made of an organic layer such as acryl resin, epoxy resin, phenolic resin, polyamide resin, or PI resin.

The light emitting element layer EML may be disposed on the thin-film transistor layer TFTL. The light emitting element layer EML may include light emitting elements 170 and a pixel defining layer 180.

The light emitting elements 170 and the pixel defining layer 180 may be disposed on the planarization layer 160. Each of the light emitting elements 170 may include a first electrode 171, the organic light emitting layer 172, and the second electrode 173.

The first electrodes 171 may be disposed on the planarization layer 160. The first electrodes 171 may be connected to the source electrodes 123 of the thin-film transistors 120 through contact holes passing through the protective layer 150 and the planarization layer 160.

In an embodiment having a top emission structure in which light is emitted from the organic light emitting layers 172 toward the second electrode 173, the first electrodes 171 may include or be made of a metal material having high reflectivity, such as a stacked structure (Ti/Al-Ti) of aluminum and titanium, a stacked structure (ITO/Al/ITO) of aluminum and ITO, an APC alloy, or a stacked structure (ITO/APC/ITO) of an APC alloy and ITO. The APC alloy is an alloy of silver (Ag), palladium (Pd), and copper (Cu).

In an embodiment having a bottom emission structure in which light is emitted from the organic light emitting layers 172 toward the first electrodes 171, the first electrodes 171 may include or be made of a transparent conductive material ("TCO") capable of transmitting light, such as ITO or indium zinc oxide ("IZO"), or a semi-transmissive conductive material such as magnesium (Mg), silver (Ag) or an alloy of Mg and Ag. In such an embodiment, where the first electrodes 171 are made of a semi-transmissive conductive material, the light output efficiency may be increased by a microcavity effect.

The pixel defining layer 180 may be disposed on the planarization layer 160 to separate the first electrodes 171 to serve as a pixel defining layer for defining subpixels RP, GP and BP. The pixel defining layer 180 may cover edges of the first electrodes 171. The pixel defining layer 180 may include or be made of an organic layer such as acryl resin, epoxy resin, phenolic resin, polyamide resin, or PI resin.

Each of the second light emitting areas EMA2 is an area where the first electrode 171, the organic light emitting layer 172, and the second electrode 173 are sequentially stacked so that holes from the first electrode 171 and electrons from the second electrode 173 combine together in the organic light emitting layer 172 to emit light. Each of the first through third light emitting areas EMA1 through EMA3 may include the light emitting element 170.

The organic light emitting layers 172 may be disposed on the first electrodes 171 and the pixel defining layer 180. Each of the organic light emitting layers 172 may include an organic material and emit light of a predetermined color. In one embodiment, for example, each of the organic light emitting layers 172 may include a hole transporting layer, an organic material layer, and an electron transporting layer.

The second electrode 173 may be disposed on the organic light emitting layers 172. In addition, the second electrode 173 may cover the organic light emitting layers 172. The second electrode 173 may be a common layer commonly provided for (or to cover) all of the first through third light emitting areas EMA1 through EMA3. A capping layer may be disposed on the second electrode 173.

In an embodiment having the top emission structure, the second electrode 173 may be made of a TCO capable of transmitting light, such as ITO or IZO, or a semi-transmissive conductive material such as magnesium (Mg), silver (Ag) or an alloy of Mg and Ag. In such an embodiment, where the second electrode 173 is made of a semi-transmissive conductive material, the light output efficiency may be increased by a microcavity effect.

In an embodiment having the bottom emission structure, the second electrode 173 may be made of a metal material having high reflectivity, such as a stacked structure (Ti/Al/Ti) of aluminum and titanium, a stacked structure (ITO/AlTO) of aluminum and ITO, an APC alloy, or a stacked structure (ITO/APC/ITO) of an APC alloy and ITO. The APC alloy is an alloy of silver (Ag), palladium (Pd), and copper (Cu).

The thin-film encapsulation layer TFEL may be disposed on the light emitting element layer EML. The thin-film encapsulation layer TFEL may include an encapsulating layer 190.

The encapsulating layer 190 may be disposed on the second electrode 173. In an embodiment, the encapsulating layer 190 may include at least one inorganic layer to prevent oxygen or moisture from penetrating into the light emitting layers 172 and the second electrode 173. In an embodiment, the encapsulating layer 190 may include at least one organic layer to protect the light emitting element layer EML from foreign substances such as dust. In one embodiment, for example, the encapsulating layer 190 may include a first inorganic layer disposed on the second electrode 173, an organic layer disposed on the first inorganic layer, and a second inorganic layer disposed on the organic layer. The first inorganic layer and the second inorganic layer may include, but are not limited to, a silicon nitride layer, a silicon oxynitride layer, a silicon oxide layer, a titanium oxide layer, or an aluminum oxide layer. The organic layer may include, but is not limited to, acryl resin, epoxy resin, phenolic resin, polyamide resin, PI resin, etc.

A second buffer layer BF2 may be disposed on the thin-film encapsulation layer TFEL. The second buffer layer BF2 may include or be composed of a plurality of inorganic layers stacked alternately. In one embodiment, for example, the second buffer layer BF2 may have a multilayer structure in which one or more inorganic layers selected from a silicon nitride layer, a silicon oxynitride layer, a silicon oxide layer, a titanium oxide layer, and an aluminum oxide layer are alternately stacked. In an alternative embodiment, the second buffer layer BF2 can be omitted.

The vibration generating unit VU may be disposed on the second buffer layer BF2, in an embodiment, the first vibration electrodes VE1 of the vibration generating unit VU may be disposed on the second buffer layer BF2. In one embodiment, for example, the first vibration electrodes VE1 may include or be made of a transparent conductive material to secure transmittance. The first vibration electrodes VE1 may be made of a transparent conductive material such as ITO or silver-nanowires (AgNWs).

The vibration layers VGL may be disposed on the first vibration electrodes VE1. In one embodiment, for example, the vibration layers VGL may include or be made of an insulating elastic material such as silicon, acryl or urethane or a piezoelectric polymer material such as PVDF or PZT (a generic term for a solid solution of zirconate ($PbZrO_3$) and titanate ($PbTiO_3$)). In an embodiment, where the vibration layers VGL are made of PVDF, they can be easily manufactured in the form of flexible films because PVDF contains polyvinylidene fluoride trifluoroethylene (PVDF-TrFE).

The second vibration electrodes VE2 may be disposed on the vibration layers VGL. The second vibration electrodes VE2 may include or be made of a transparent conductive material to secure transmittance. The second vibration electrodes VE2 may be made of a transparent conductive material such as ITO or silver-nanowires (AgNWs).

The first vibration electrodes VE1 and the second vibration electrodes VE2 may contact upper and lower surfaces of the vibration layers VGL, respectively. In an embodiment, the first vibration electrodes VE1, the second vibration electrodes VE2, and the vibration layers VGL may overlap the second light emitting areas EMA2 in the thickness direction.

Although not illustrated, in an embodiment, the first vibration electrodes VE1 and the second vibration electrodes VE2 may be defined by metal meshes. In such an embodiment, openings corresponding to the second openings OP2 may be formed in each of the first vibration electrodes VE1 and the second vibration electrodes VE2.

The touch detection unit TDU is disposed on the second vibration electrodes VE2. The touch detection unit TDU may include the first touch electrodes TE, the second touch electrodes RE, the first connection electrodes BE1 the second connection electrodes BE2, the driving lines TL1 through TL16, the sensing lines RL1 through RL33, the guard lines GL1 through GL6, and the ground lines GRL1 through GRL4 as illustrated in FIG. 9. In FIG. 11, for convenience of illustration, only a first touch electrode TE of the touch detection unit TDU is illustrated.

A second insulating layer IL2 and a third insulating layer IL3 may be disposed on the second vibration electrodes VE2.

The second insulating layer IL2 may include an inorganic material. In one embodiment, for example, the second insulating layer IL2 may include a silicon nitride layer, a silicon oxynitride layer, a silicon oxide layer, a titanium oxide layer, or an aluminum oxide layer.

The third insulating layer IL3 may include an organic material. In one embodiment, for example, the third insulating layer IL3 may include at least any one of acrylic resin, methacrylic resin, polyisoprene, vinyl resin, epoxy resin, urethane resin, cellulose resin, siloxane resin, P1 resin, polyamide resin and perylene resin.

The second connection electrodes BE2 may be disposed between the second insulating layer IL2 and the second buffer layer BF2, and the first touch electrodes TE, the second touch electrodes RE and the first connection electrodes BE1 may be disposed between the second insulting layer IL2 and the third insulating layer IL3. In such an embodiment, the driving lines TL1 through TL16, the sensing lines RL1 through RL33, the guard lines GL1 through GL6, and the ground lines GRL1 through GRL4 may be disposed between the second insulating layer IL2 and the third insulating layer IL3. The second connection electrodes BE2 may be disposed on the third insulating layer IL3. However, embodiments are not limited thereto, and alternatively, the second connection electrodes BE2 may also be disposed under the second insulating layer IL2. In such an embodiment, a third buffer layer may be further provided between the second vibration electrodes VE2 and the second insulating layer IL2, and the second connection electrodes BE2 may be disposed between the third buffer layer and the second insulating layer IL2.

The first touch electrodes TE, the second touch electrodes RE, the first connection electrodes BE1, the second connection electrodes BE2, the driving lines TL1 through TL16, the sensing lines RL1 through RL33, the guard lines GL1 through GL6, and the ground lines GRL1 through GRL4 may include a conductive material. In one embodiment, for example, the conductive material may include a metal or an alloy thereof. In an embodiment, the metal may include gold (Au), silver (Ag), aluminum (Al), molybdenum (Mo), chromium (Cr), titanium (Ti), nickel (Ni), neodymium (Nd), copper (Cu), or platinum (Pt), for example. The first touch electrodes TE, the second touch electrodes RE, the first connection electrodes BE1, the second connection electrodes BE2, the driving lines TL1 through TL16, the sensing lines RL1 through RL33, the guard lines GL1 through GL6, and the ground lines GRL1 through GRL4 may include or be made of a transparent conductive material. In an embodiment, the transparent conductive material may include silver nanowires (AgNWs), ITO, IZO, antimony zinc oxide ("AZO"), ITZO, zinc oxide (ZnO), tin oxide ($SnO_2$), carbon nanotubes, or graphene, for example.

In an embodiment, the first touch electrodes TE, the second touch electrodes RE, the first connection electrodes BE1, the second connection electrodes BE2, the driving lines TL through TL16, the sensing lines RL1 through RL33, the guard lines GL1 through GL6, or the ground lines GRL1 through GRL4 may have a single layer structure or a multilayer structure. In an embodiment, where each of the first touch electrodes TE has a multilayer structure, each of the first touch electrodes TE may include a plurality of metal layers. In one embodiment, for example, each of the first touch electrodes TE may have a three-layer structure of Ti/Al/Ti.

Figure 19:
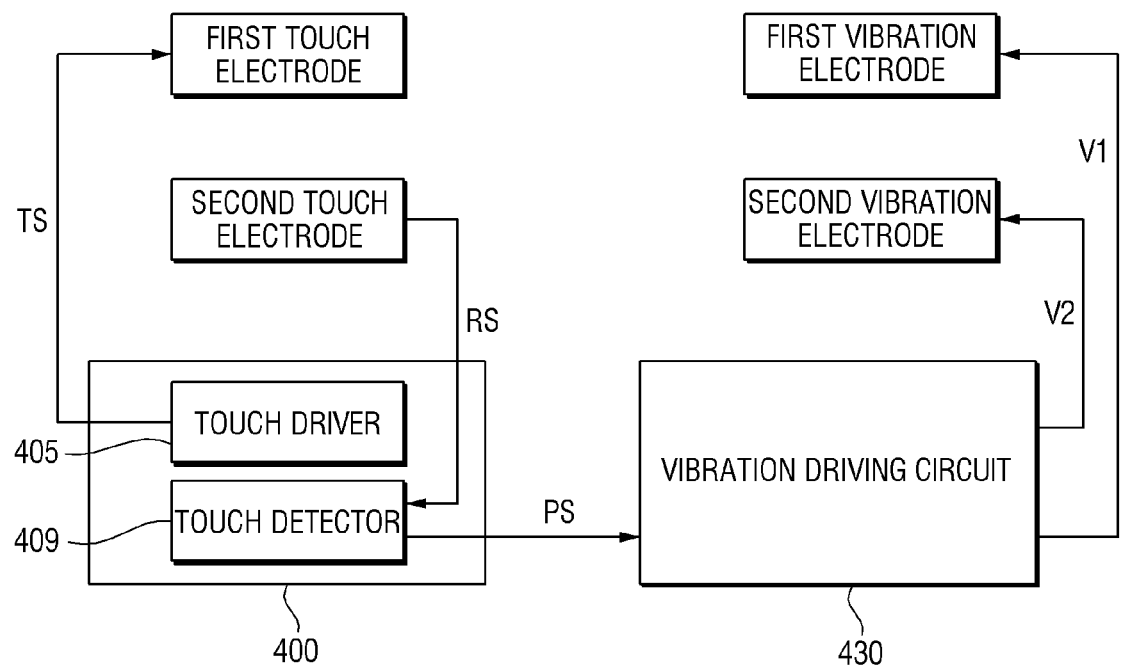
FIG. 19 is a schematic block diagram of the touch sensing unit and the vibration generating unit according to an embodiment.
Figure 20:
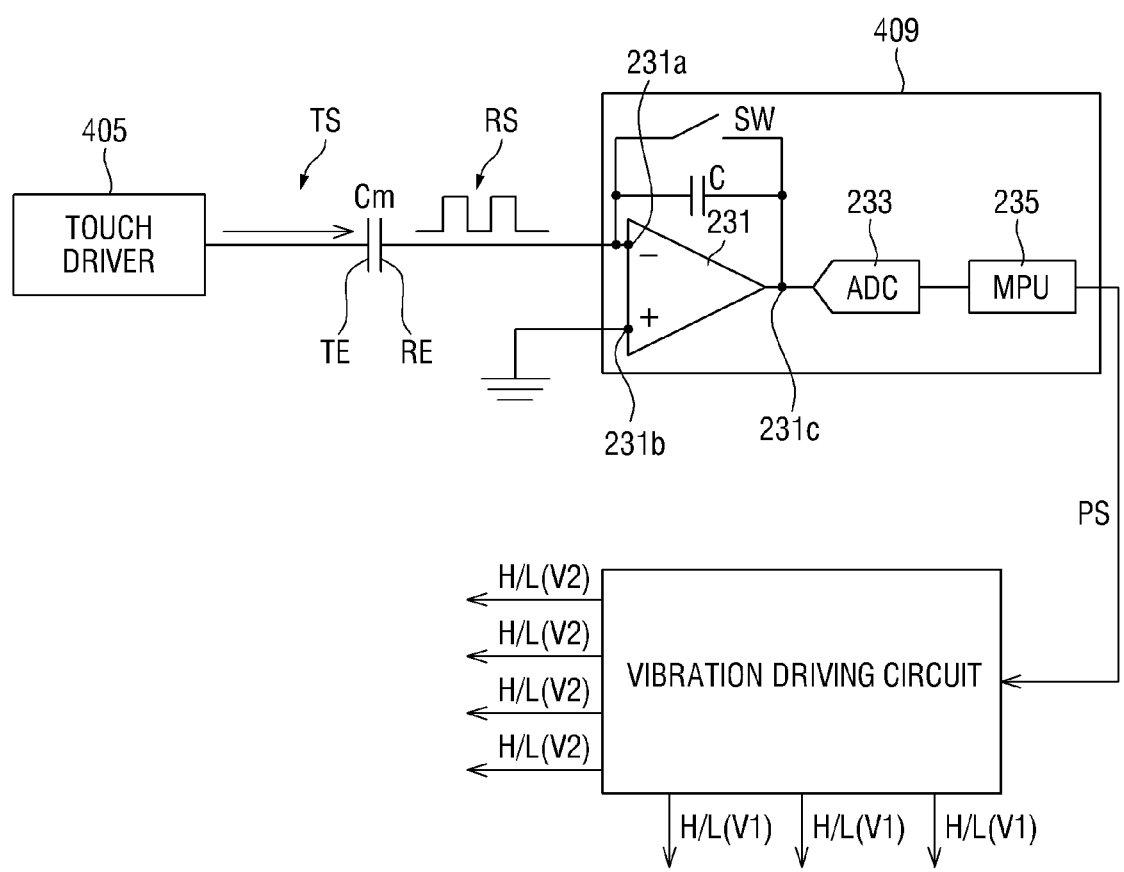
FIG. 20 is a diagram for explaining the touch position detection of the touch sensing unit and the vibration generation of the vibration generating unit according to an embodiment.
Figure 21:
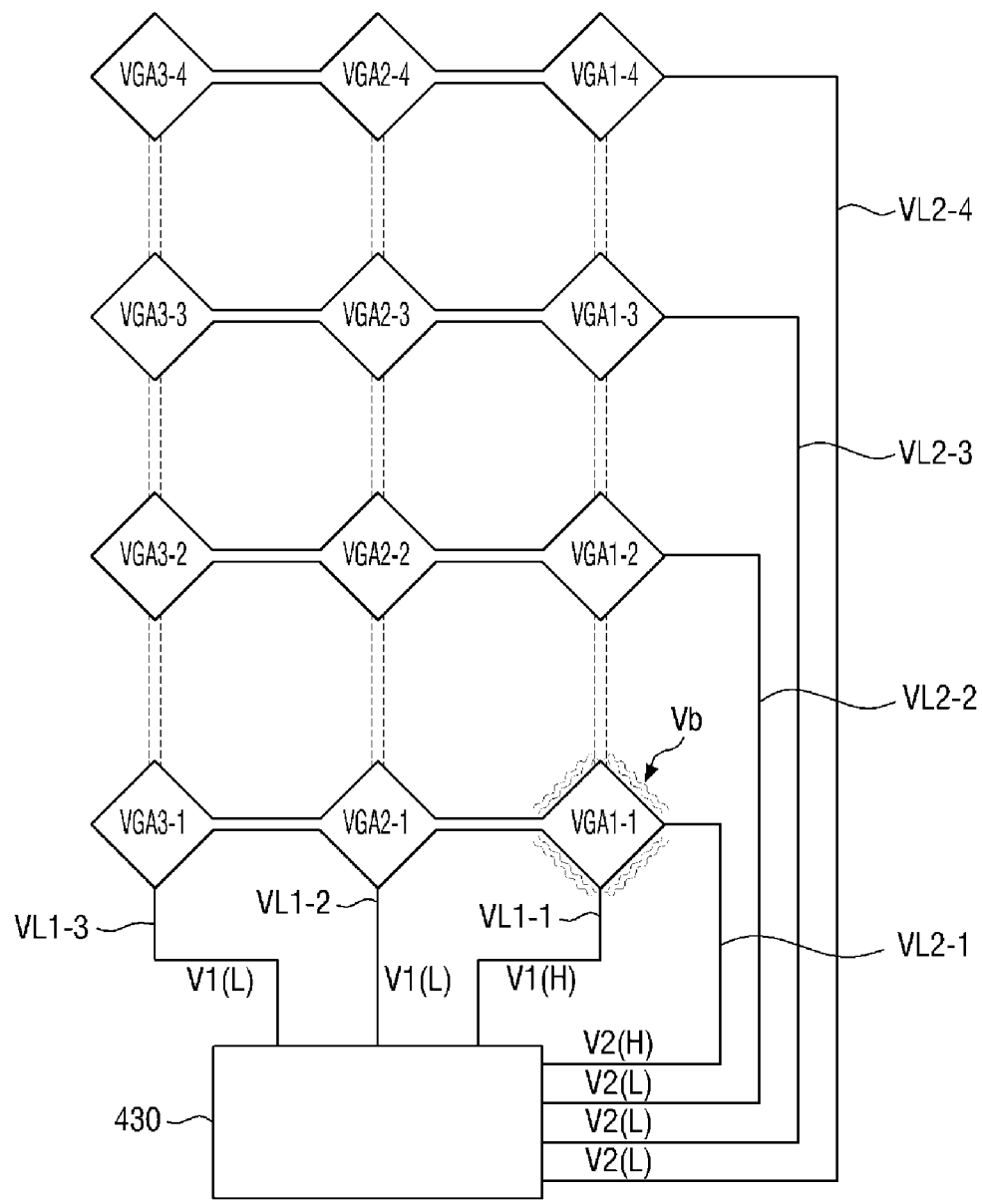
FIGS. 21 through 23 schematically illustrate how vibrations are generated in vibration generating areas.
Figure 22:
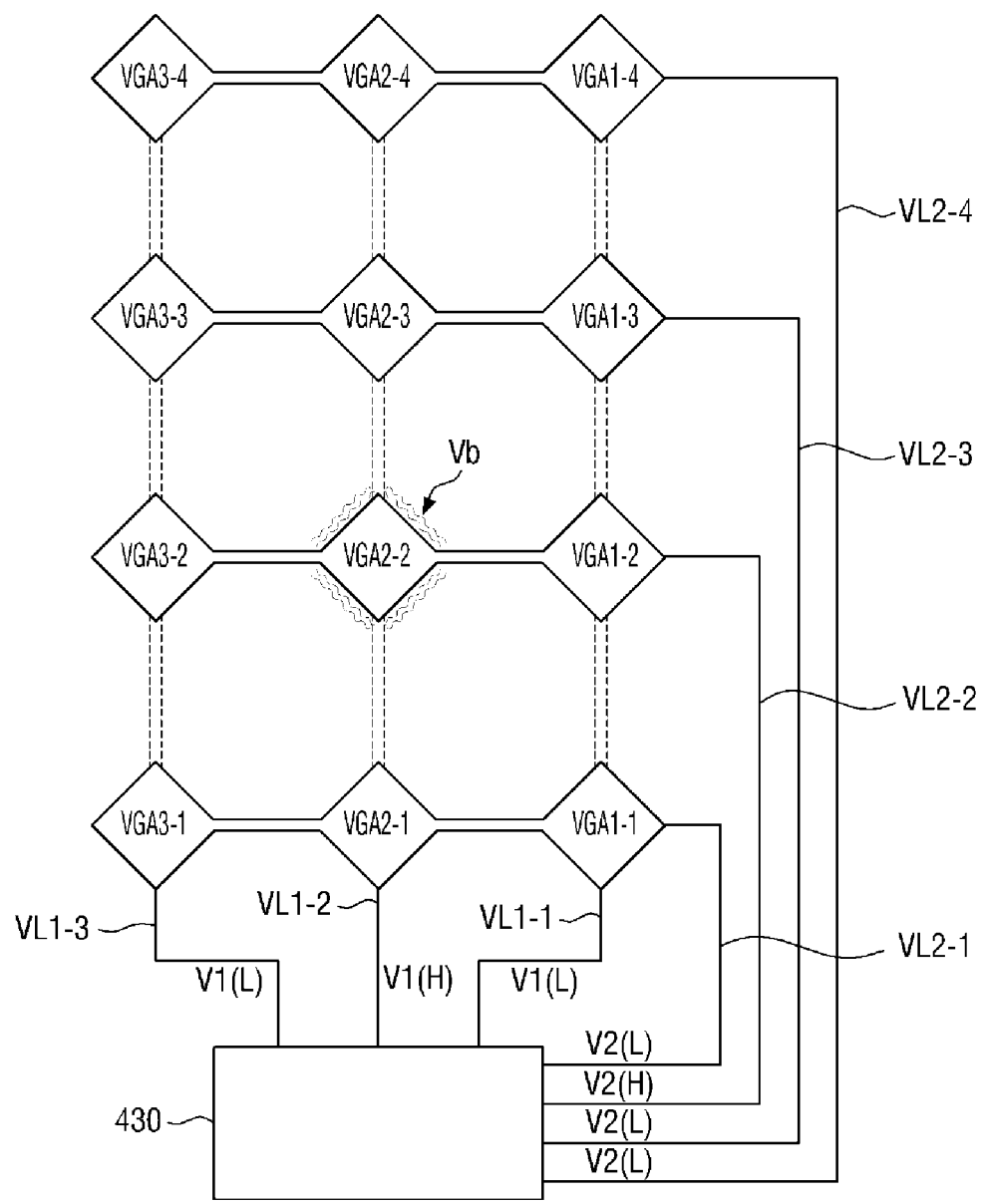
Figure 23:
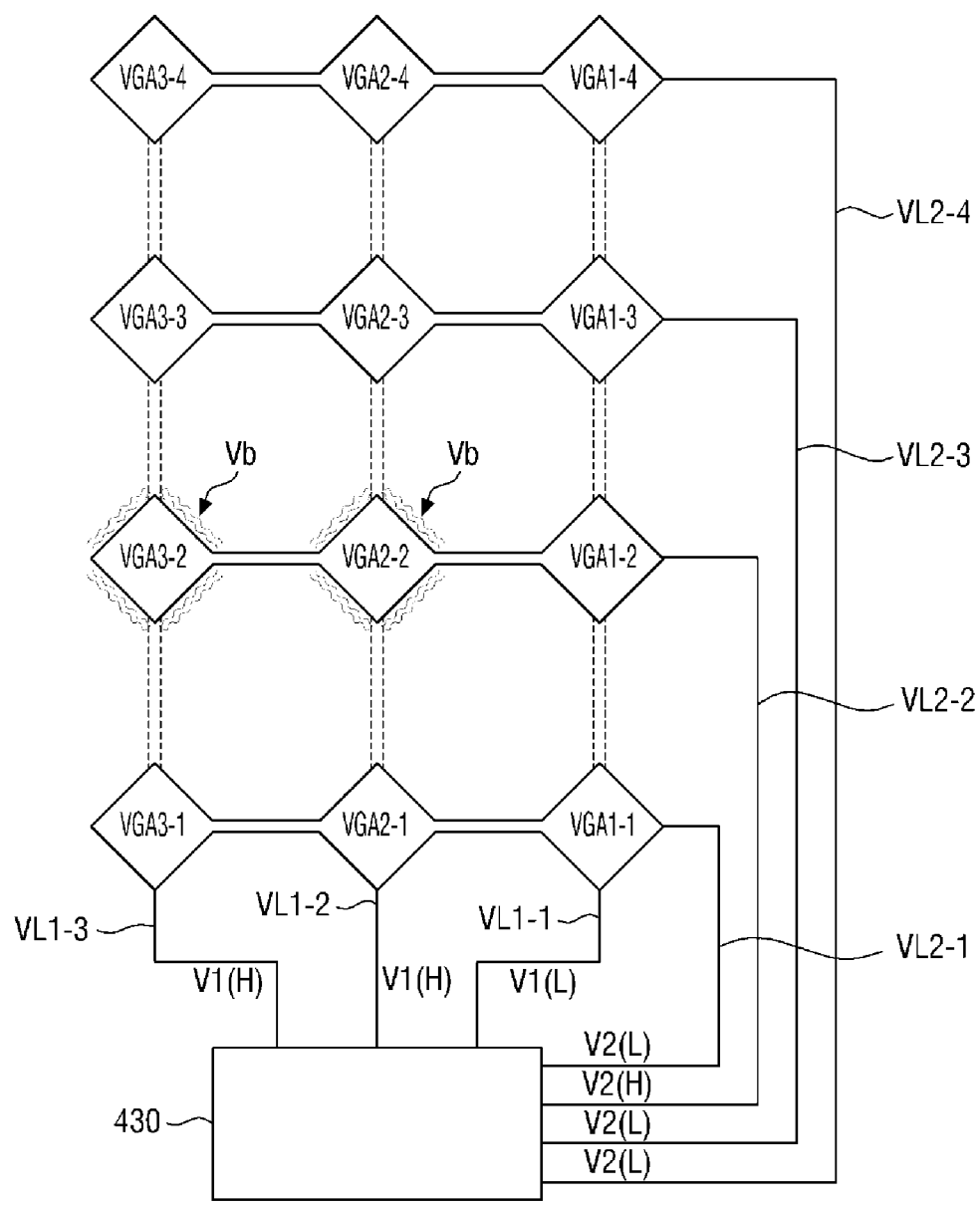
Figure 24:
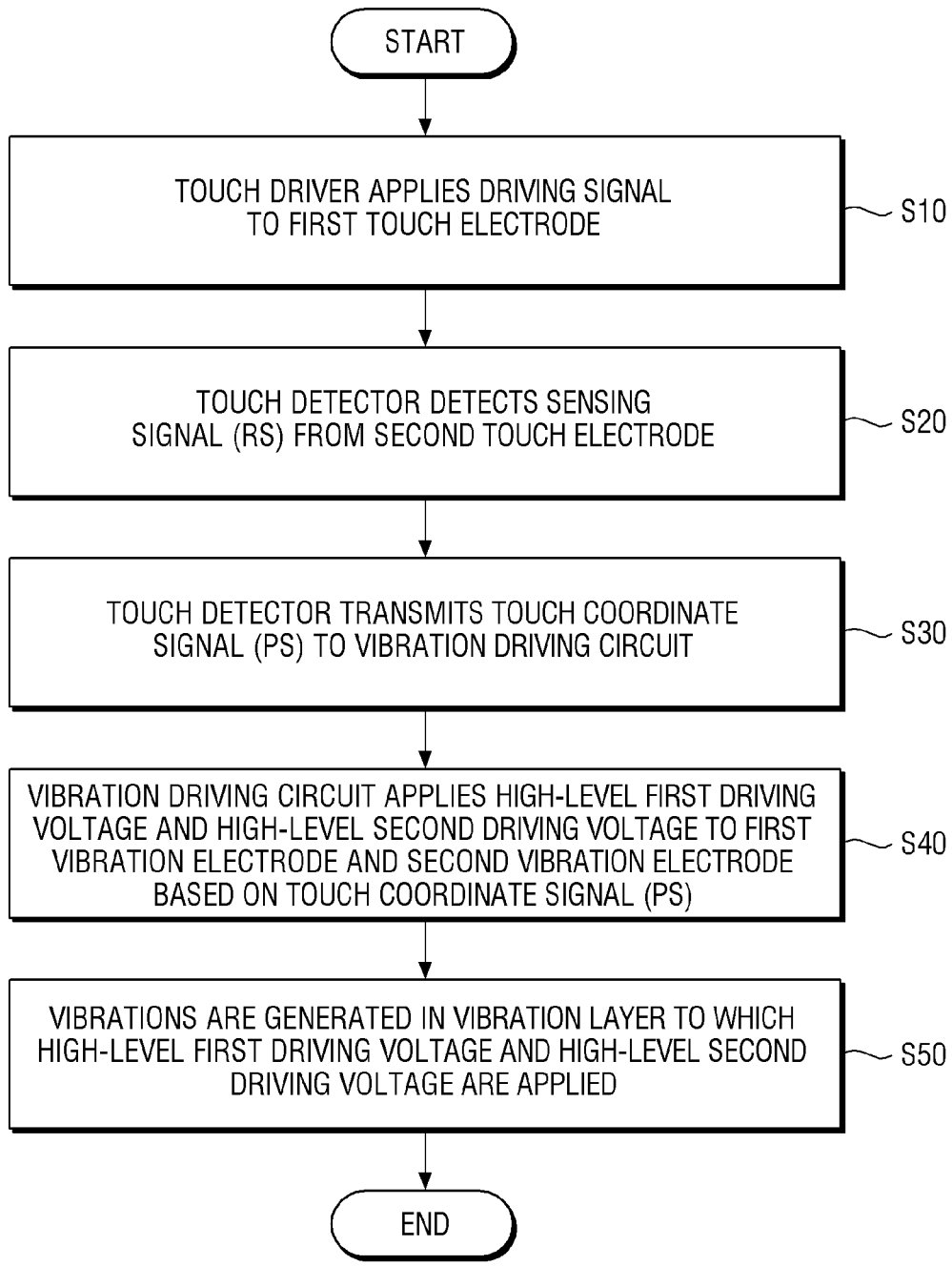
FIG. 24 is a flowchart illustrating a method of driving a display device according to an embodiment.

FIG. 19 is a schematic block diagram of the touch detection unit TDU and the vibration generating unit VU according to an embodiment. FIG. 20 is a diagram for explaining the touch position detection of the touch detection unit TDU and the vibration generation of the vibration generating unit VU according to an embodiment. FIGS. 21 through 23 schematically illustrate how vibrations are generated in vibration generating areas. FIG. 24 is a flowchart illustrating a method of driving a display device according to an embodiment.

Referring to FIG. 19 and back to FIG. 9, the touch driving circuit 400 may be electrically connected to the first touch electrodes TE and the second touch electrodes RE to supply a driving signal TS to each of the first touch electrodes TE and may detect a touch position by receiving a sensing signal RS corresponding to the driving signal TS from each of the second touch electrodes RE.

In an embodiment, the touch driving circuit 400 may include a touch driver 405 and a touch detector 409.

The touch driver 405 may provide the driving signal TS for detecting a touch input to each of the first touch electrodes TE.

The touch detector 409 may receive the sensing signal RS corresponding to the driving signal TS from each of the second touch electrodes RE and may detect the presence or absence of a touch input and/or the position of the touch input based on the received sensing signal RS. In an embodiment, the sensing signal RS may be a change in mutual capacitance generated between a first touch electrode TE and a second touch electrode RE. In one embodiment, for example, when a touch input occurs, the capacitance at a position of the touch input or around the position changes. The touch detector 409 receives the change in mutual capacitance between a first touch electrode TE and a second touch electrode RE as the sensing signal RS and identifies the presence or absence of the touch input and/or the position of the touch input by using the sensing signal RS. In such an embodiment, the touch detector 40) may transmit a touch coordinate signal PS indicating the presence or absence of the touch input and/or the position of the touch input to the vibration driving circuit 430.

The vibration driving circuit 430 may apply a first driving voltage V1 to the first vibration electrode VE1 and apply a second driving voltage V2 to the second vibration electrode VE2 according to the touch coordinate signal PS. Then, vibrations may be generated in an area to which the first driving voltage V1 and the second driving voltage V2 are applied.

In an embodiment, referring to FIGS. 20 and 24, the touch driver 405 may provide the driving signal TS to each of the first touch electrodes TE through the driving lines TL (operation S10). In an embodiment, the driving signal TS may be sequentially provided to each of the first touch electrodes TE.

The touch detector 409 may receive the sensing signal RS from each of the second touch electrodes RE through the sensing lines RL (operation S20). In an embodiment, the sensing signal RS may include information about a change in mutual capacitance generated between a first touch electrode TE and a second touch electrode RE as described above. When the driving signal TS is provided to a first touch electrode TE, mutual capacitance Cm is formed between the first touch electrode TE and a second touch electrode RE. When a touch input occurs, the mutual capacitance Cm changes, and the sensing signal RS may include information about the change in the mutual capacitance.

In an embodiment, the touch detector 409 may include an amplifier 231 such as an operational amplifier ("OP AMP"), an analog-digital converter 233, and a processor 235.

The amplifier 231 may include a first input terminal 231a, a second input terminal 231b, and an output terminal 231c. According to an embodiment, the first input terminal 231a of the amplifier 231, for example, an inverting input terminal of the OP AMP, may be electrically connected to the second touch electrodes RE by the sensing lines RL, and the sensing signal RS may be input to the first input terminal 231a.

In an embodiment, the second input terminal 231b of the amplifier 231, for example, a non-inverting input terminal of the OP AMP, may be a reference potential terminal and may be connected to, for example, a reference power source. In an embodiment, the reference power source may be a ground power source.

In an embodiment, a capacitor C and a reset switch SW may be connected in parallel between the first input terminal 231a and the output terminal 231c of the amplifier 231.

In an embodiment, the amplifier 231 may be implemented as a non-inverting amplifier as described above, but embodiments are not limited thereto. In an alternative embodiment, the amplifier 231 may be implemented in an inverting amplifier.

The output terminal 231c of the amplifier 231 may be electrically connected to the analog-digital converter 233.

The analog-digital converter 233 may convert an input analog signal into a digital signal.

The processor 235 processes a converted signal (digital signal) output from the analog-digital converter 233 and detects a touch input based on the signal processing result. In one embodiment, for example, the processor 235 may detect the occurrence of a touch input and the position of the touch input by comprehensively analyzing a first sensing signal amplified by the amplifier 231 and converted by the analog-digital converter 233. According to an embodiment, the processor 235 may be implemented as a microprocessor ("MPU"). In such an embodiment, a memory for driving the processor 235 may be additionally provided in the touch detector 409. Alternatively, the processor 235 may be implemented as a microcontroller ("MCU").

The processor 235 may transmit the touch coordinate signal PS generated based on a detected touch input and touch position to the vibration driving circuit 430 (operation S30).

The vibration driving circuit 430 may apply the first driving voltage V1 to the first vibration electrodes VE1 through the first vibration lines VL1-1 through VL1-3 and apply the second driving voltage V2 to the second vibration electrodes VE2 through the second vibration lines VL2-1 through VL2-4 in response to the touch coordinate signal PS (operation S40). The first driving voltage V1 and the second driving voltage V2 may be either high-level voltages or low-level voltages. Vibrations may be generated in a vibration layer VGL disposed in an area where each of the first driving voltage V1 and the second driving voltage V2 is a high-level voltage (operation S50). However, embodiments are not limited thereto, and alternatively, the vibration driving circuit 430 may include a switch and control whether to apply a voltage through on-off of the switch.

Referring to FIG. 21, when a user touches the first first vibration generating area VGA1-1, a high-level first driving voltage V1(H) may be applied to the first first vibration line VL1-1, a low-level first driving voltage V1(L) may be applied to the second first vibration line VL1-2, a low-level first driving voltage V1(L) may be applied to the third first vibration line VL1-3, a high-level second driving voltage V2(H) may be applied to the first second vibration line VL2-1, a low-level second driving voltage V2(L) may be applied to the second second vibration line VL2-2, a low-level second driving voltage V2(L) may be applied to the third second vibration line VL2-3, and a low-level second driving voltage V2(L) may be applied to the fourth second vibration line VL2-4. Thus, vibrations Vb may be generated in the first first vibration generating area VGA1-1 to which the high-level first driving voltage V1(H) and the high-level second driving voltage V2(H) are applied.

Referring to FIG. 22, when a user touches the second second vibration generating area VGA2-2, a low-level first driving voltage V1(L) may be applied to the first first vibration line VL1-1, a high-level first driving voltage V1(H) may be applied to the second first vibration line VL1-2, a low-level first driving voltage V1(L) may be applied to the third first vibration line VL1-3, a low-level second driving voltage V2(L) may be applied to the first second vibration line VL2-1, a high-level second driving voltage V2(H) may be applied to the second second vibration line VL2-2, a low-level second driving voltage V2(L) may be applied to the third second vibration line VL2-3, and a low-level second driving voltage V2(L) may be applied to the fourth second vibration line VL2-4. Thus, vibrations Vb may be generated in the second second vibration generating area VGA2-2 to which the high-level first driving voltage V1(H) and the high-level second driving voltage V2(H) are applied.

Referring to FIG. 23, when a user touches the second second vibration generating area VGA2-2 and the second third vibration generating area VGA3-2, a low-level first driving voltage V1(L) may be applied to the first first vibration line VL1-1, a high-level first driving voltage V1(H) may be applied to the second first vibration line VL1-2, a high-level first driving voltage V(H) may be applied to the third first vibration line VL1-3, a low-level second driving voltage V2(L) may be applied to the first second vibration line VL2-1, a high-level second driving voltage V2(H) may be applied to the second second vibration line VL2-2, a low-level second driving voltage V2(L) may be applied to the third second vibration line VL2-3, and a low-level second driving voltage V2(L) may be applied to the fourth second vibration line VL2-4. Thus, vibrations Vb may be generated in the second second vibration generating area VGA2-2 and the second third vibration generating area VGA3-2 to which the high-level first driving voltage V1(H) and the high-level second driving voltage V2(H) are applied.

In an embodiment, as described above, the first vibration electrodes VE1, the second vibration electrodes VE2, and the vibration layers VGL may be patterned to define vibration generating areas, and the vibration generating areas may be driven based on touch coordinates. Accordingly, haptic feedback may be provided only at a position corresponding to a touch thereon such that power consumption is reduced while improving haptic characteristics.

In embodiments of a display device and a method of driving the display device, a vibration generator having a vibration layer patterned in each area is disposed on a display panel. Therefore, power consumption may be reduced while haptic sensitivity is improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display unit including a display area and a non-display area; and
a vibration generating unit disposed on the display unit and including a vibration area and a non-vibration area,
wherein the vibration generating unit comprises first vibration electrodes, second vibration electrodes facing the first vibration electrodes, vibration layers disposed between the first vibration electrodes and the second vibration electrodes, and an insulating layer,
wherein the vibration layers are disposed in the vibration area and spaced apart from each other, and
the insulating layer is disposed between the vibration layers and not disposed between the first vibration electrodes and second vibration electrodes overlapping each other, the insulating layer contacting only a side edge defining the first vibration electrode and an entire height of an edge defining the vibration layer.

2. The display device of claim 1, wherein
the first vibration electrodes are spaced apart from each other,
the second vibration electrodes are spaced apart from each other, and
the first vibration electrodes and the second vibration electrodes overlap each other with the vibration layers interposed between the first vibration electrodes and the second vibration electrodes.

3. The display device of claim 2, wherein the vibration generating unit further comprises:
a first connection pattern which connects the first vibration electrodes in a first direction; and
a second connection pattern which connects the second vibration electrodes in a second direction intersecting the first direction.

4. The display device of claim 3, wherein a width of the first connection pattern in the second direction is smaller than a width of each of the first vibration electrodes in the second direction.

5. The display device of claim 4, wherein a width of the second connection pattern in the first direction is smaller than a width of each of the second vibration electrodes in the first direction.

6. The display device of claim 5, wherein the first connection pattern and the second connection pattern overlap the insulating layer in a thickness direction.

7. The display device of claim 6, further comprising:
first vibration pads and second vibration pads which are disposed in the non-vibration area; and
first vibration lines which are connected to the first vibration electrodes,
wherein
one ends of the vibration lines are respectively connected to the first vibration electrodes disposed in the same row, and
other ends of the vibration lines are respectively connected to the first vibration pads.

8. The display device of claim 7, further comprising:
second vibration lines which are connected to the second vibration electrodes,
wherein
one ends of the second vibration lines are respectively connected to the second vibration electrodes disposed in the same column, and
the other ends of the second vibration lines are respectively connected to the second vibration pads.

9. The display device of claim 1, wherein the vibration layers comprise a ferroelectric polymer.

10. The display device of claim 9, wherein the vibration layers comprise polyvinylidene fluoride.

11. The display device of claim 1, further comprising:
a touch detection unit disposed on the vibration generating unit.

12. The display device of claim 11, further comprising:
a vibration driving circuit which applies driving voltages to the first vibration electrodes and the second vibration electrodes; and
a touch driving circuit which detects a touch input and calculates touch coordinates of the touch input,
wherein the touch driving circuit transmits a touch coordinate signal to the vibration driving circuit.

13. The display device of claim 1, further comprising:
a touch detection unit disposed between the display unit and the vibration generating unit.

14. A display device comprising:
a display unit including a display area and a non-display area;
a vibration generating unit disposed on the display unit and including a vibration area and a non-vibration area; and
an insulating layer disposed on the display unit,
wherein the vibration generating unit further includes vibration generating areas disposed in the vibration area and spaced apart from each other, and
each of the vibration generating areas comprises:
a first vibration electrode and a second vibration electrode facing each other; and
a vibration layer disposed between the first vibration electrode and the second vibration electrode, and
the insulating layer which is disposed in a same layer as the vibration layer and surrounds the vibration layer, and not disposed between the first vibration electrode and second vibration electrode overlapping each other, the insulating layer contacting only a side edge defining the first vibration electrode and an entire height of an edge defining the vibration layer.

15. The display device of claim 14, wherein the vibration layer comprises polyvinylidene fluoride and is provided in plural in a form of islands in the vibration area.

16. The display device of claim 15, further comprising:
a touch detection unit which is disposed on the vibration generating unit and comprises a plurality of touch electrodes,
wherein each of the vibration generating areas correspond to each of the touch electrodes.

17. A method of driving a display device comprising a display unit, a vibration generating unit disposed on the display unit and including vibration generating areas spaced apart from each other, and a touch detection unit disposed directly on the vibration generating unit, the method comprising:

sensing a touch on the display device by using the touch detection unit; and providing a haptic feedback based on coordinates of the touch by using the vibration generating unit, wherein the providing the haptic feedback comprises generating vibrations by applying a driving voltage to a vibration generating area corresponding to the coordinates of the touch by using the vibration generating unit disposed between the touch detection unit and the display unit, wherein the vibration generating unit comprises first vibration electrodes, second vibration electrodes facing the first vibration electrodes, vibration layers disposed between the first vibration electrodes and the second vibration electrodes, and an insulating layer, wherein the vibration layers are disposed in the vibration area and spaced apart from each other, and the insulating layer is disposed between the vibration layers and not disposed between the first vibration electrodes and second vibration electrodes overlapping each other, the insulating layer contacting only a side edge defining the first vibration electrode and an entire height of an edge defining the vibration layer.

18. The method of claim 17, wherein the display device further comprises a vibration driving circuit which applies the driving voltage and a touch driving circuit which senses the touch, wherein the method further comprises transmitting a touch coordinate signal generated based on the coordinates of the touch from the touch driving circuit to the vibration driving circuit.

\* \* \* \* \*